(12) United States Patent
Wu et al.

(10) Patent No.: US 12,100,672 B2
(45) Date of Patent: Sep. 24, 2024

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 128 days.

(21) Appl. No.: 17/813,906

(22) Filed: Jul. 20, 2022

(65) Prior Publication Data

US 2022/0352096 A1 Nov. 3, 2022

Related U.S. Application Data

(62) Division of application No. 16/746,115, filed on Jan. 17, 2020, now Pat. No. 11,616,026.

(51) Int. Cl.
*H01L 21/683* (2006.01)
*H01L 21/48* (2006.01)
(Continued)

(52) U.S. Cl.
CPC ........ *H01L 23/562* (2013.01); *H01L 21/4853* (2013.01); *H01L 21/4857* (2013.01); *H01L 21/486* (2013.01); *H01L 21/563* (2013.01); *H01L 21/6835* (2013.01); *H01L 23/145* (2013.01); *H01L 23/3185* (2013.01);
(Continued)

(58) Field of Classification Search
None
See application file for complete search history.

(56) References Cited

U.S. PATENT DOCUMENTS 8,987,922 B2   3/2015   Yu et al.
8,993,380 B2   3/2015   Hou et al.
(Continued)

FOREIGN PATENT DOCUMENTS

CN   107665887 A   2/2018
CN   109786267 A   5/2019
(Continued)

OTHER PUBLICATIONS

Hitachi High-Tech Corporation. "Semiconductor Glossary." Hitachi High-Tech Corporation, www.hitachi-hightech.com/global/en/knowledge/semiconductor/room/words.html. Accessed Jan. 23, 2024. (Year: 2024).*

*Primary Examiner* — Jay C Chang
(74) *Attorney, Agent, or Firm* — Slater Matsil, LLP

(57) ABSTRACT

A device includes an interconnect device attached to a redistribution structure, wherein the interconnect device includes conductive routing connected to conductive connectors disposed on a first side of the interconnect device, a molding material at least laterally surrounding the interconnect device, a metallization pattern over the molding material and the first side of the interconnect device, wherein the metallization pattern is electrically connected to the conductive connectors, first external connectors connected to the metallization pattern, and semiconductor devices connected to the first external connectors.

20 Claims, 17 Drawing Sheets

(51) Int. Cl.
*H01L 21/56* (2006.01)
*H01L 23/00* (2006.01)
*H01L 23/14* (2006.01)
*H01L 23/31* (2006.01)
*H01L 23/498* (2006.01)
*H01L 23/538* (2006.01)

(52) U.S. Cl.
CPC .. *H01L 23/49822* (2013.01); *H01L 23/49827* (2013.01); *H01L 23/49833* (2013.01); *H01L 23/49838* (2013.01); *H01L 23/5381* (2013.01); *H01L 2221/68372* (2013.01)

(56) References Cited

U.S. PATENT DOCUMENTS

| | | | |
|---|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,196,532 B2 | 11/2015 | Tu et al. |
| 9,196,559 B2 | 11/2015 | Tsai et al. |
| 9,257,333 B2 | 2/2016 | Lu et al. |
| 9,263,511 B2 | 2/2016 | Yu et al. |
| 9,263,839 B2 | 2/2016 | Chen et al. |
| 9,275,924 B2 | 3/2016 | Wang et al. |
| 9,275,925 B2 | 3/2016 | Chen et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 9,831,148 B2 | 11/2017 | Yu et al. |
| 10,541,226 B2 | 1/2020 | Yu et al. |
| 10,784,203 B2 | 9/2020 | Huang et al. |
| 11,315,891 B2 | 4/2022 | Tsai et al. |
| 2006/0226527 A1 | 10/2006 | Hatano et al. |
| 2012/0273908 A1* | 11/2012 | Kinsman | H04N 23/54 257/E31.127 |
| 2014/0360759 A1 | 12/2014 | Kunieda et al. |
| 2016/0155705 A1 | 6/2016 | Mahajan et al. |
| 2016/0329284 A1* | 11/2016 | We | H01L 25/0655 |
| 2017/0084596 A1 | 3/2017 | Scanlan |
| 2017/0238422 A1 | 8/2017 | Leitgeb et al. |
| 2017/0301650 A1* | 10/2017 | Yu | H01L 24/82 |
| 2018/0005987 A1 | 1/2018 | Hiner et al. |
| 2018/0261535 A1* | 9/2018 | Lin | H01L 23/544 |
| 2019/0043792 A1 | 2/2019 | Weerasekera et al. |
| 2019/0131287 A1 | 5/2019 | Huang et al. |
| 2019/0157222 A1 | 5/2019 | Lakhera et al. |
| 2019/0164806 A1 | 5/2019 | Leobandung |
| 2019/0198445 A1* | 6/2019 | Alur | H01L 21/4853 |
| 2019/0304912 A1 | 10/2019 | Ecton et al. |
| 2019/0393112 A1 | 12/2019 | Nofen et al. |
| 2020/0243449 A1 | 7/2020 | Chiang et al. |
| 2020/0303309 A1* | 9/2020 | Sankman | H01L 23/5385 |
| 2020/0381361 A1 | 12/2020 | Zhao et al. |
| 2020/0395300 A1 | 12/2020 | Xie et al. |

FOREIGN PATENT DOCUMENTS

| | | |
|---|---|---|
| CN | 110299351 A | 10/2019 |
| JP | 2014236188 A | 12/2014 |
| JP | 20160969196 A | 5/2016 |
| KR | 20180051611 A | 5/2018 |
| TW | 201923987 A | 6/2019 |
| WO | 2017049269 A1 | 3/2017 |
| WO | 2019132965 A1 | 7/2019 |

\* cited by examiner

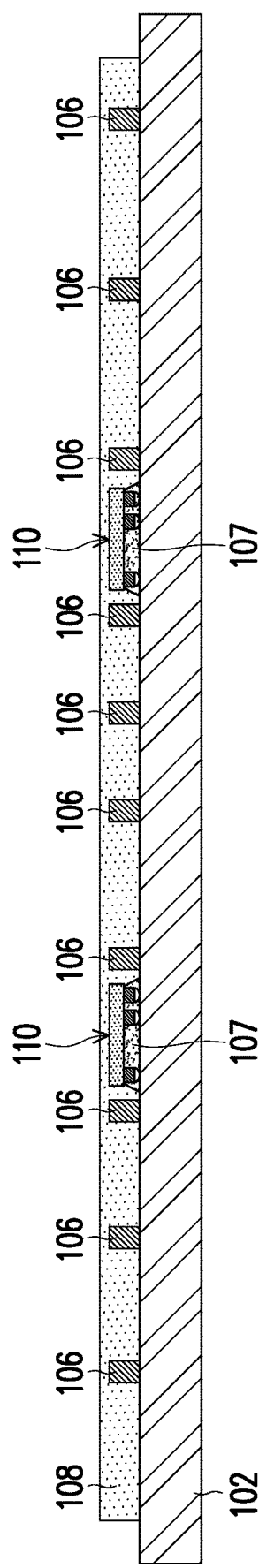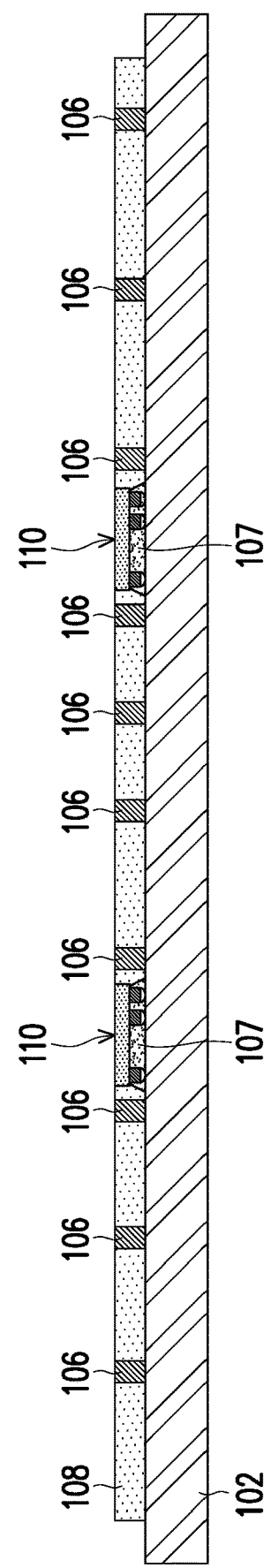

SEMICONDUCTOR DEVICE AND METHOD OF MANUFACTURE

PRIORITY CLAIM

This application is a divisional of U.S. patent application Ser. No. 16/746,115, entitled "Semiconductor Device and Method of Manufacture," filed on Jan. 17, 2020, which application is incorporated herein by reference.

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area. Integrated circuits with high functionality require many input/output pads. Yet, small packages may be desired for applications where miniaturization is important.

Integrated Fan Out (InFO) package technology is becoming increasingly popular, particularly when combined with Wafer Level Packaging (WLP) technology in which integrated circuits are packaged in packages that typically include a redistribution layer (RDL) or post passivation interconnect that is used to fan-out wiring for contact pads of the package, so that electrical contacts can be made on a larger pitch than contact pads of the integrated circuit. Such resulting package structures provide for high functional density with relatively low cost and high performance packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 6 illustrate cross-sectional views of intermediate steps of forming a device structure including interconnect devices, in accordance with some embodiments.

DETAILED DESCRIPTION

Figure 1:
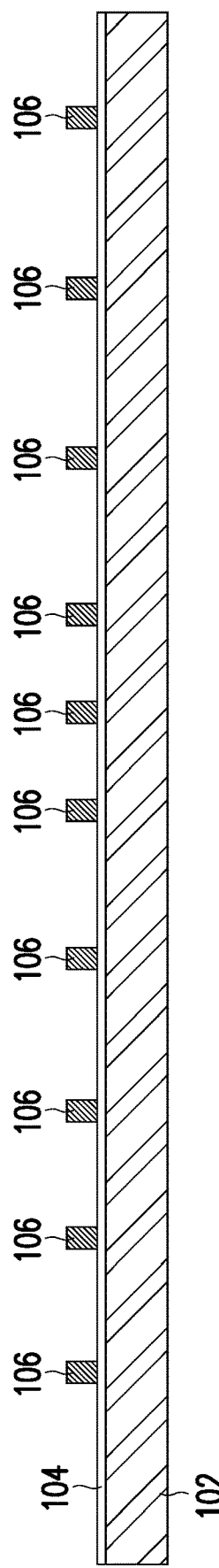

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure, various aspects of a package and the formation thereof are described. In some embodiments, interconnect devices incorporated within the package may electrically connect two or more semiconductor die. The interconnect device may have a high routing density and be located close to the semiconductor die, which can improve the bandwidth of communication between the semiconductor dies. The interconnect device may also allow for reduced warpage and improved connection reliability of the package. Additionally, other types of electronic devices such as integrated passive devices (IPDs) or integrated voltage regulators (IVRs) may be incorporated into the package in a manner similar to that of the interconnect devices, and provide additional functionality to the package.

Figure 16:
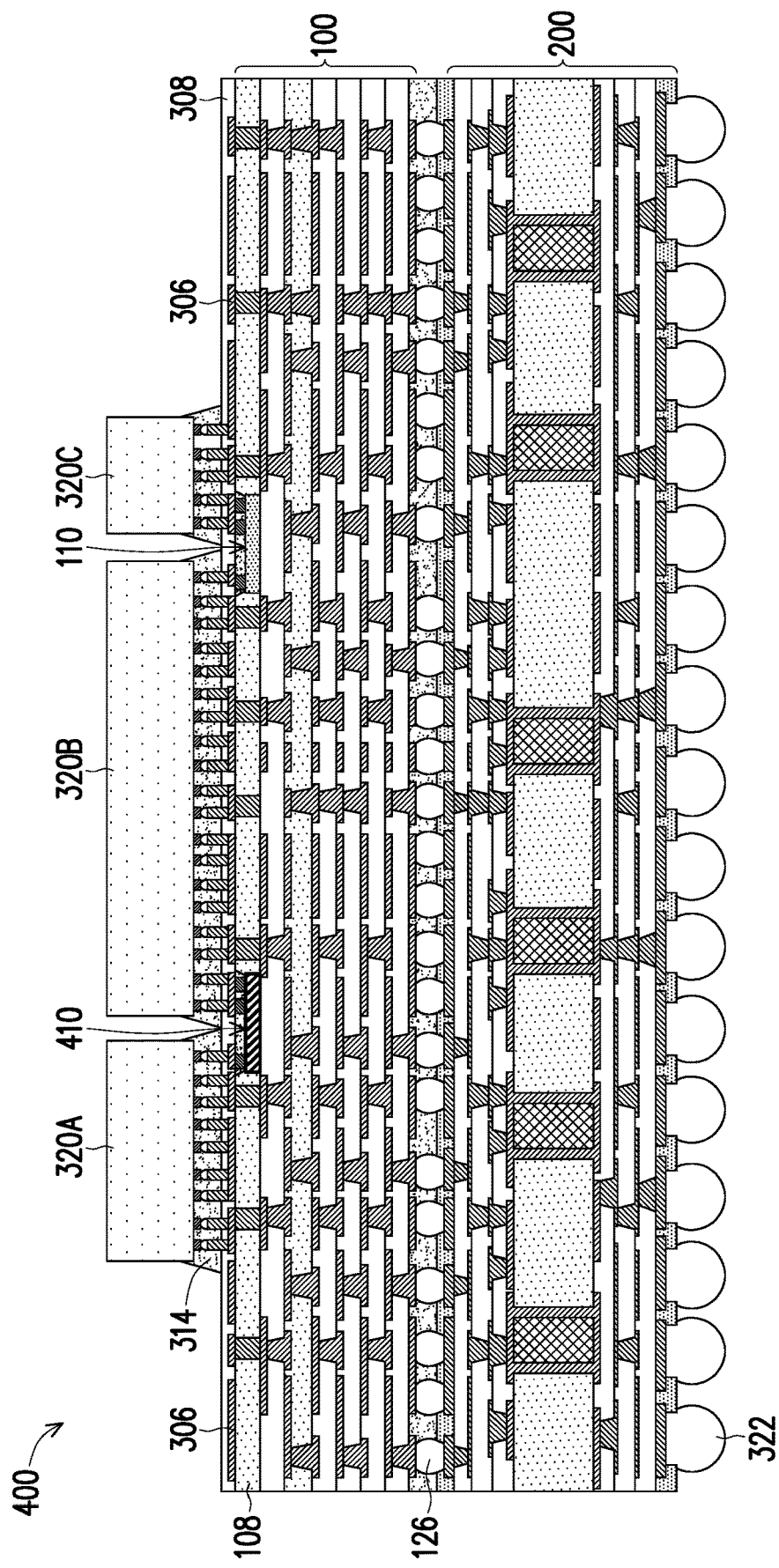
FIG. 16 illustrates a cross-sectional view of a package, in accordance with some embodiments.
Figure 17:
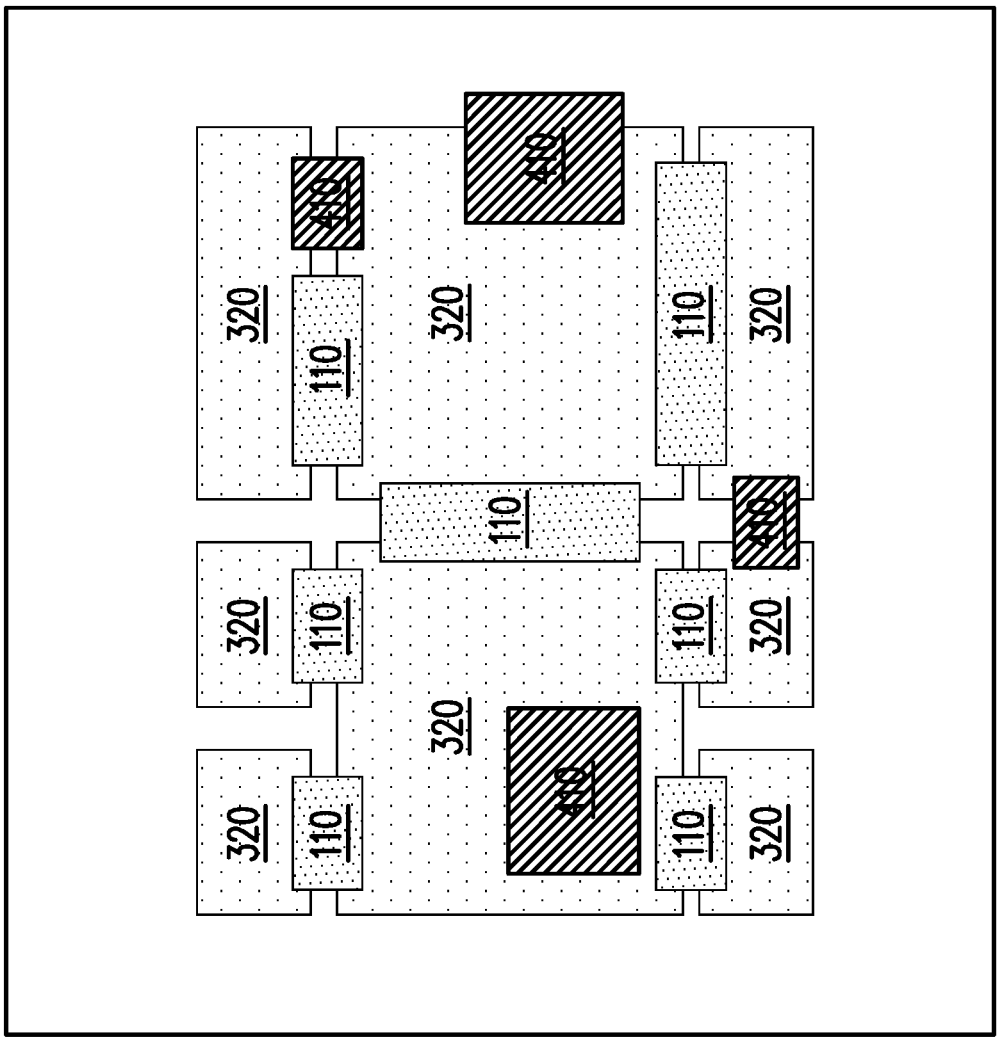
FIG. 17 illustrates a plan view of a package, in accordance with some embodiments.

FIGS. 1 through 6 illustrate cross-sectional views of intermediate steps of forming a device structure 100 (see FIG. 6) with interconnect devices 110 in accordance with some embodiments. FIGS. 7A and 7B illustrate cross-sectional views of intermediate steps of attaching an interconnect structure 200 to the device structure 100, in accordance with some embodiments. FIGS. 8 through 13 illustrate cross-sectional views of intermediate steps of forming a package 300 (see FIG. 13) incorporating, e.g., the device structure 100, in accordance with some embodiments. FIG. 14 illustrates a plan view of a package 350, in accordance with some embodiments. FIG. 16 illustrates a cross-sectional view of a package 400, in accordance with some embodiments. FIG. 17 illustrates a plan view of a package 450, in accordance with some embodiments.

Turning to FIG. 1, there is shown a first carrier substrate 102 on which through-molding vias (TMVs) 106 have been formed, in accordance with some embodiments. The first carrier substrate 102 may include, for example, silicon-based materials, such as a silicon substrate (e.g., a silicon wafer), a glass material, silicon oxide, or other materials, such as aluminum oxide, the like, or a combination. In some embodiments, the first carrier substrate 102 may be a panel structure, which may be, for example, a supporting substrate formed from a suitable dielectric material, such as a glass material, a plastic material, or an organic material. The panel structure may be, for example, a rectangular panel.

Figure 18A:
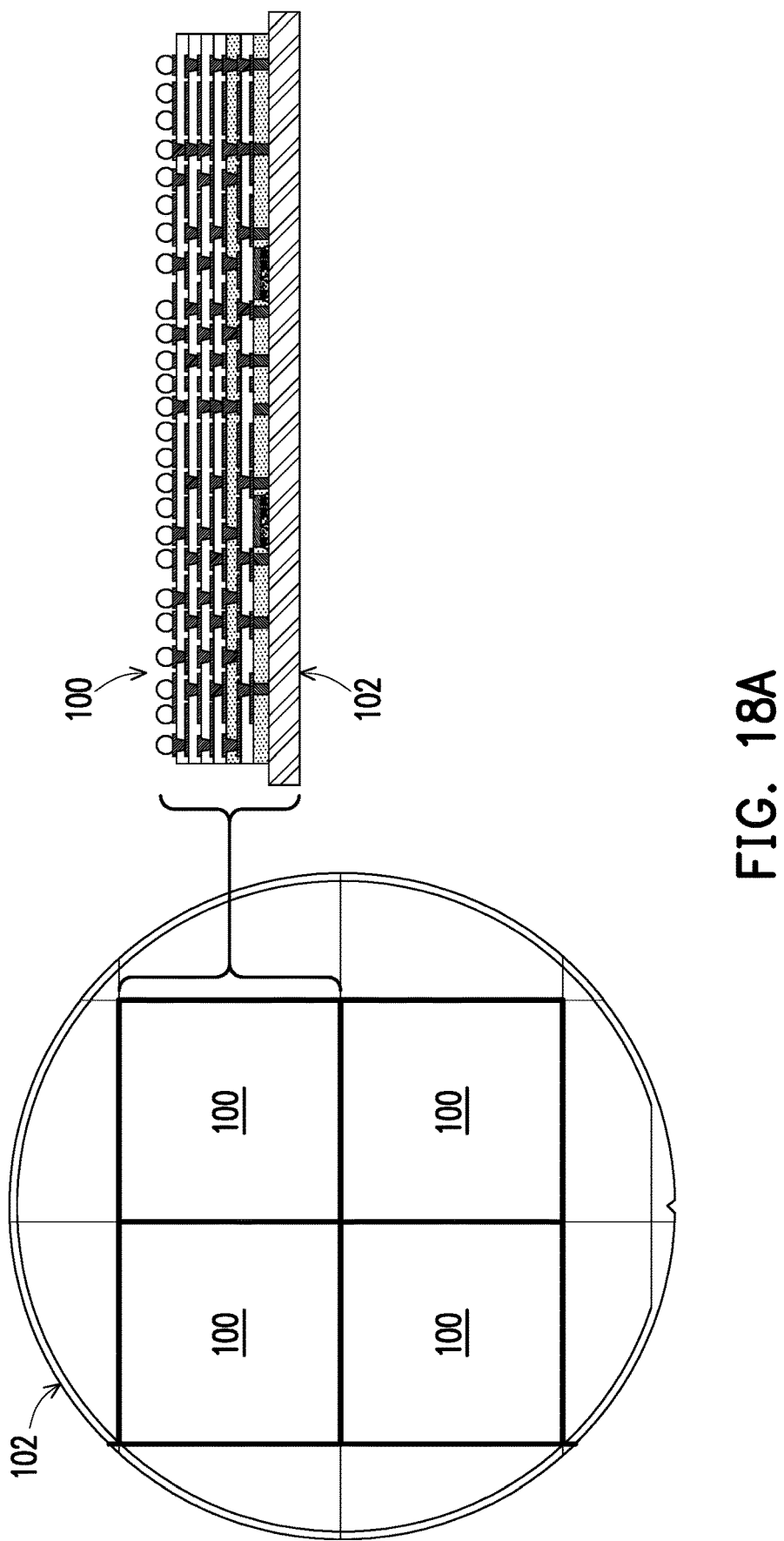
FIGS. 18A and 18B illustrate intermediate steps of forming a device structure on different types of carrier substrates, in accordance with some embodiments.
Figure 18B:
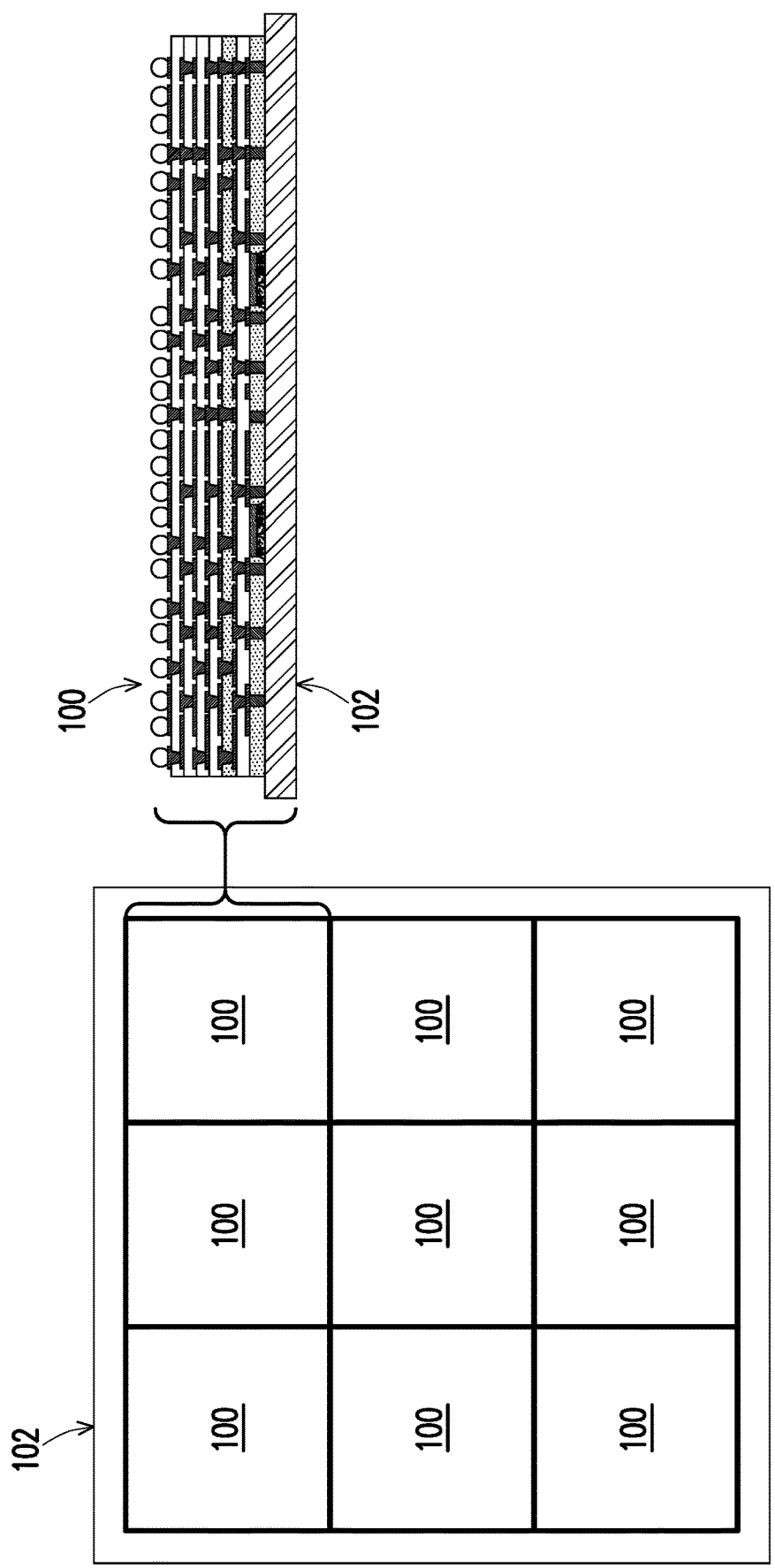

As illustrative examples, FIGS. 18A and 18B show device structures 100 (see FIG. 6) formed using different types of carrier substrates 102, in accordance with some embodiments. FIG. 18A shows an embodiment in which the carrier substrate 102 is a silicon wafer, and FIG. 18B shows an embodiment in which the carrier substrate 102 is a panel structure. FIGS. 18A-18B show multiple device structures 100 formed on the carrier substrates 102. In this manner, different types of carrier substrates 102 may be used to form multiple device structures 100. The structures formed on the first carrier substrate 102 may be subsequently singulated.

In some embodiments, a release layer (not shown) may be formed on the top surface of the first carrier substrate 102 to facilitate subsequent debonding of first carrier substrate 102. In some embodiments, the release layer may be formed of a polymer-based material, which may be removed along with the first carrier substrate 102 from the overlying structures that will be formed in subsequent steps. In some embodiments, the release layer is an epoxy-based thermal-release material, which loses its adhesive property when heated, such as a Light-to-Heat-Conversion (LTHC) release coating. In other embodiments, the release layer may be an ultraviolet (UV) glue, which loses its adhesive property when exposed to UV light. The release layer may be dispensed as a liquid and cured, may be a laminate film laminated onto the first carrier substrate 102, or the like. The top surface of the release layer may be leveled and may have a high degree of co-planarity. In some embodiments, a die attach film (DAF) (also not shown) may be used instead of or in addition to the release layer.

In an embodiment, the TMVs 106 may be formed by initially forming a seed layer 104. In some embodiments, the seed layer 104 is a metal layer, which may be a single layer or a composite layer comprising multiple sub-layers formed of different materials. In some embodiments, the seed layer 104 comprises a titanium layer and a copper layer over the titanium layer, though the seed layer 104 may comprise different materials or different layers in other embodiments. The seed layer 104 may be formed using a suitable process such as PVD, CVD, sputtering, or the like. The seed layer 104 is formed over the first carrier substrate 102 (or over a release layer, if present). A photoresist (also not shown) may then be formed to cover the seed layer 104 and then be patterned to expose those portions of the seed layer that are located where the TMVs 106 will subsequently be formed. Once the photoresist has been formed and patterned, a conductive material may be formed on the seed layer 104. The conductive material may be a material such as copper, titanium, tungsten, aluminum, another metal, the like, or a combination thereof. The conductive material may be formed through a deposition process such as electroplating, electroless plating, or the like. However, while the material and methods discussed are suitable to form the conductive material, these are merely examples. Any other suitable materials or any other suitable processes of formation, such as CVD or PVD, may alternatively be used to form the TMVs 106. Once the conductive material has been formed, the photoresist may be removed through a suitable removal process such as an ashing process or a chemical stripping process, such as using oxygen plasma or the like. In some embodiments, the seed layer 104 is not removed after forming the TMVs 106. In some embodiments, the TMVs 106 may have a height that is between about 3 μm and about 100 μm.

Figure 2:
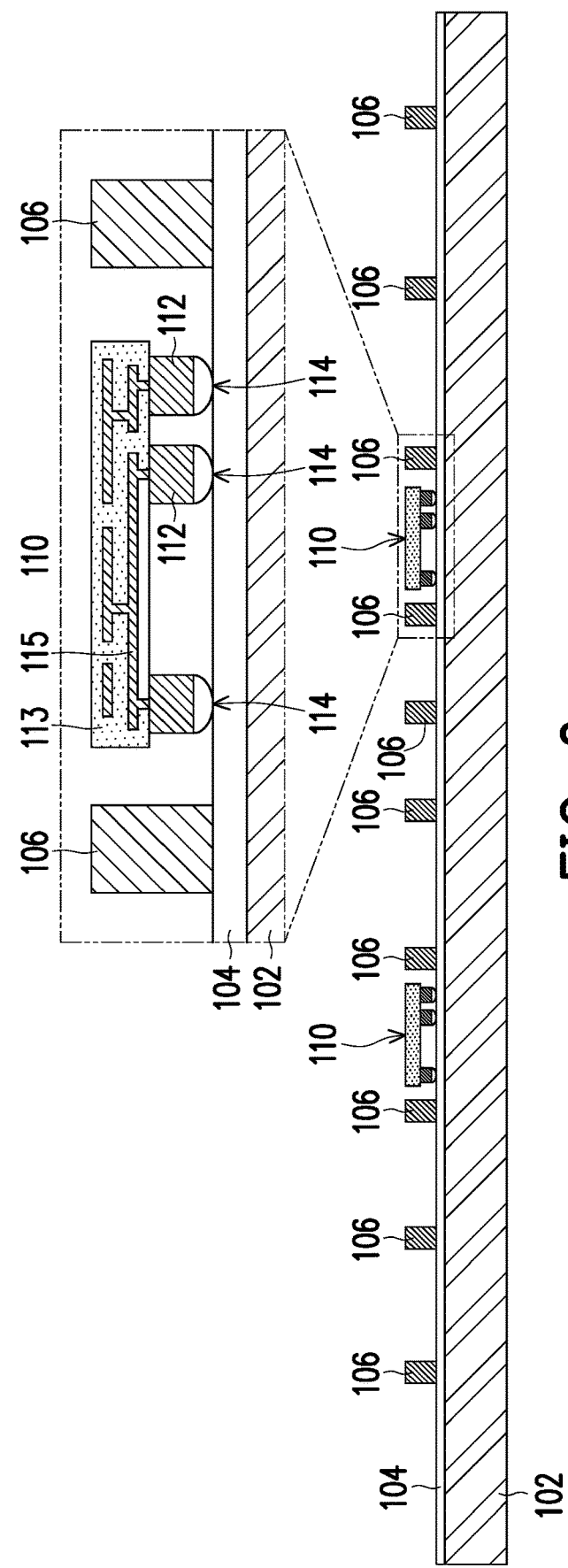

Turning to FIG. 2, interconnect devices 110 are attached to the first carrier substrate 102, in accordance with some embodiments. FIG. 2 also shows a magnified view of an example interconnect device 110 and neighboring TMVs 106 on the first carrier substrate 102. In some embodiments, the interconnect devices 110 comprise conductive connectors 112, which may be used to make electrical connections to the interconnect devices 110. The interconnect devices 110 shown in FIG. 2 have conductive connectors 112 formed on a single side of each interconnect device 110, but in some embodiments, an interconnect device 110 may have conductive connectors 112 formed on both sides. In some embodiments, a solder material 114 is formed on each conductive connector 112 prior to attachment. FIG. 2 shows two interconnect devices 110 attached to the first carrier substrate 102, but in other embodiments, only one or more than two interconnect devices 110 may be attached. The attached interconnect devices 110 may include multiple similar interconnect devices 110 and/or more than one different type of interconnect device 110. In some embodiments, other types of devices may be attached to the first carrier substrate 102 in addition to interconnect devices 110, such as electronic devices 410 described below in FIGS. 16-17.

In some embodiments, the conductive connectors 112 comprise metal pads or metal pillars (such as copper pillars). The conductive connectors 112 may include a conductive material such as solder, copper, aluminum, gold, nickel, silver, palladium, tin, the like, or a combination thereof. In some embodiments, the metal pillars may be solder-free and/or have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In some embodiments, the pitch of the conductive connectors 112 may be between about 20 μm and about 80 μm, and the height of the conductive connectors 112 may be between about 2 μm and about 30 μm.

In some embodiments, the solder material 114 formed on the conductive connectors 112 may be ball grid array (BGA) connectors, solder balls, controlled collapse chip connection (C4) bumps, micro bumps (e.g., μ bumps), electroless nickel-electroless palladium-immersion gold technique (ENEPIG) formed bumps, or the like. The solder material 114 may include a conductive material such as solder, copper, aluminum, gold, nickel, silver, palladium, tin, the like, or a combination thereof. In some embodiments, the solder material 114 is formed by initially forming a layer of solder through evaporation, electroplating, printing, solder transfer, ball placement, or the like. Once a layer of solder has been formed on the conductive connectors 112, a reflow may be performed in order to shape the material into the desired shapes.

The interconnect devices 110 may be placed on the first carrier substrate 102, for example, using e.g., a pick-and-place process. In some embodiments, once the solder material 114 of the interconnect devices 110 is in physical contact with the seed layer 104, a reflow process may be performed to bond the solder material 114 to the seed layer 104 and thus attach the interconnect devices 110 to the first carrier substrate 102.

In some embodiments, the interconnect devices 110 comprise one or more layers of electrical routing 115 (e.g., redistribution layers (RDLs), metallization patterns, metal lines and vias, or the like) formed in a substrate 113. In some embodiments, an interconnect device 110 comprising electrical routing 115 is used to form interconnections or additional routing between other devices in a package, such as semiconductor devices (e.g., the semiconductor devices 320A-C in package 300 shown in FIG. 13), dies, chips, or the like. In some embodiments, an interconnect device 110 comprises one or more active devices (e.g., transistors, diodes, or the like) and/or one or more passive devices (e.g., capacitors, resistors, inductors, or the like). In some embodiments, an interconnect device 110 includes electrical routing 115 and is substantially free of active or passive devices. In some embodiments, an interconnect device 110 may have a thickness (excluding conductive connectors 112 or solder material 114) that is between about 10 μm and about 100 μm. In some embodiments, an interconnect device 110 may have lateral dimensions between about 2 mm by 2 mm and about 80 mm by 80 mm, such as about 2 mm by 3 mm or 50 mm by 80 mm.

The interconnect devices 110 may be formed using applicable manufacturing processes. The substrate 113 may be, for example, a semiconductor substrate, such as silicon, which may be doped or undoped, and which may be a silicon wafer or an active layer of a semiconductor-on-insulator (SOI) substrate, or the like. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The electrical routing 115 may be formed of alternating layers of dielectric (e.g., low-k dielectric material) and conductive material (e.g., copper) with vias interconnecting the layers of conductive material and may be formed through any suitable process (such as deposition, damascene, dual damascene, or the like).

The electrical routing 115 of the interconnect devices 110 may be formed of any suitable conductive material using any suitable process. In some embodiments, a damascene process is utilized in which the respective dielectric layer is patterned and etched utilizing photolithography techniques to form trenches corresponding to the desired pattern of metallization layers and/or vias. An optional diffusion barrier and/or optional adhesion layer may be deposited and the trenches may be filled with a conductive material. Suitable materials for the barrier layer includes titanium, titanium nitride, tantalum, tantalum nitride, or other alternatives, and suitable materials for the conductive material include copper, silver, gold, tungsten, aluminum, combinations thereof, or the like. In an embodiment, the metallization layers may be formed by depositing a seed layer of copper or a copper alloy, and filling the trenches by electroplating. A chemical mechanical planarization (CMP) may be used to remove excess conductive material from a surface of the respective dielectric layer and to planarize the surface for subsequent processing.

In some embodiments, the electrical routing 115 of an interconnect device 110 may comprise fine-pitch RDLs having a pitch less than about 1 μm. The fine-pitch RDLs may be formed, for example, using single damascene and/or dual damascene processes, described above. By forming electrical routing 115 having a fine pitch, the density of the electrical routing 115 in an interconnect device 110 may be increased, thus improving the routing ability of the interconnect device 110. In some cases, a higher density of electrical routing 115 in an interconnect device 110 may allow a smaller amount of routing (e.g., RDLs of redistribution structure 120 in FIG. 5 or routing layers 212/213 of interconnect structure 200 in FIG. 7A) to be formed elsewhere in a package (e.g., package 300 shown in FIG. 13). This can decrease the size of a package, reduce the processing cost of a package, or improve performance by reducing the routing distances within a package. In some cases, the use of a fine-pitch formation process (e.g., a damascene or dual damascene process) may allow for improved conduction and connection reliability within the interconnect devices 110. In some cases, during high-speed operation (e.g., greater than about 2 Gbit/second), electrical signals may be conducted near the surfaces of conductive components. Fine-pitch routing may have less surface roughness than other types of routing, and thus can reduce resistance experienced by higher-speed signals and also reduce signal loss (e.g. insertion loss) during high-speed operation. This can improve the performance of high-speed operation, for example, of Serializer/Deserializer ("SerDes") circuits or other circuits that may be operated at higher speeds.

Turning to FIG. 3, the interconnect devices 110 and TMVs 106 are encapsulated using an encapsulant 108, in accordance with some embodiments. Prior to encapsulation, an underfill 107 is deposited in the gap between each interconnect device 110 and the first carrier substrate 102. The underfill 107 may be a material such as a molding compound, an epoxy, an underfill, a molding underfill (MUF), a resin, or the like. The underfill 107 can protect the conductive connectors 112 and provide structural support for the interconnect devices 110. In some embodiments, the underfill 107 may be cured after deposition. The encapsulation may be performed in a molding device or the encapsulant 108 may be deposited using another technique. The encapsulant 108 may be, for example, a molding compound such as a resin, polyimide, PPS, PEEK, PES, epoxy molding compound (EMC), another material, the like, or a combination thereof. The encapsulant 108 may surround and/or cover the interconnect devices 110 and TMVs 106, as shown in FIG. 3.

In FIG. 4, a planarization process is performed on the encapsulant 108, in accordance with some embodiments. The planarization process may be performed, e.g., using a mechanical grinding process, a chemical mechanical polishing (CMP) process, or the like. The planarization process removes excess portions of encapsulant 108 and exposes the TMVs 106. In some cases, the planarization process may also expose one or more of the interconnect devices 110. After the planarization process, the TMVs 106 and/or the interconnect devices 110 may have surfaces level with a surface of the encapsulant 108.

Figure 5:
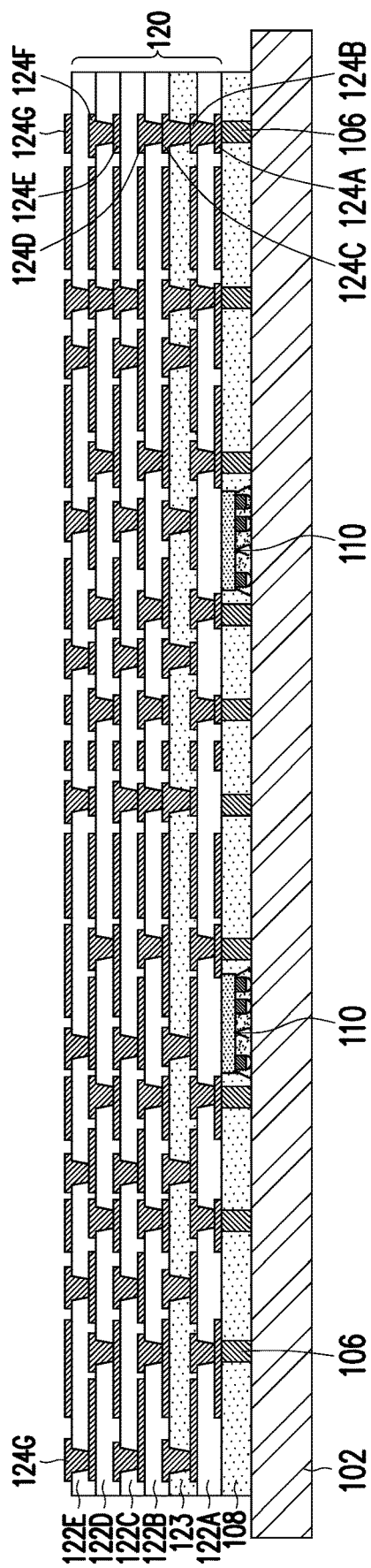

Turning to FIG. 5, a redistribution structure 120 is formed over the interconnect devices 110, the TMVs 106, and the encapsulant 108, in accordance with some embodiments. The redistribution structure 120 makes electrical connections to the TMVs 106. In some embodiments in which the interconnect devices have conductive connectors 112 on a side opposite the first carrier substrate 102, the redistribution structure 120 may make electrical connection to these conductive connectors. The redistribution structure 120 shown includes insulating layers 122A-E and 123, and includes redistribution layers (RDLs) 124A-G. In other embodiments, different numbers of insulating layers or RDLs may be formed in the redistribution structure 120 than shown in FIG. 5. For example, in some embodiments, the redistribution structure 120 may include between about 1 and about 15 insulation layers or RDLs, or another number of insulation layers or RDLs. In some embodiments, the insulating layers may comprise different materials, for example, insulating layers 122A-E are a different material than insulating layer 123, described in greater detail below. In some embodiments, the redistribution structure 120 may be, for example, a fan-out structure.

Still referring to FIG. 5, a first insulating layer 122A is formed over the interconnect devices 110, the TMVs 106, and the encapsulant 108. The insulating layer 122A may be made of one or more suitable dielectric materials such as an oxide (e.g., silicon oxide), a nitride (e.g., silicon nitride), a polymer material, a polyimide material, a low-k dielectric material, a molding material (e.g., an EMC or the like), another dielectric material, the like, or a combination thereof. The insulating layer 122A may be formed by a process such as spin-coating, lamination, CVD, the like, or a combination thereof. The insulating layer 122A may have a thickness between about 1 µm and about 50 µm, such as about 5 µm, although any suitable thickness may be used. In some embodiments, openings into the insulating layer 122A may be formed using a suitable photolithographic mask and etching process. For example, a photoresist may be formed and patterned over the insulating layer 122A, and one or more etching processes (e.g., a wet etching process or a dry etching process) are utilized to remove portions of the insulating layer 122A. In some embodiments, the insulating layer 122A is formed of a photosensitive polymer such as PBO, polyimide, BCB, or the like, in which openings may be patterned directly using a photolithographic mask and etching process. The openings in the insulating layer 122A may expose the TMVs 106 and, if present, conductive connectors 112 of interconnect devices 110.

A first RDL 124A is then formed over the insulating layer 122A. The RDL 124A may be a patterned conductive layer (e.g., a metallization pattern) that includes line portions (also referred to as conductive lines) on and extending along the major surface of the insulating layer 122A. The RDL 124A further includes via portions (also referred to as conductive vias) extending through the insulating layer 122A to physically and electrically couple the TMVs 106 (and, if present, conductive connectors 112 of interconnect devices 110). In an embodiment, the RDL 124A may be formed by initially forming a seed layer (not shown). In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a suitable formation process such as PVD, CVD, sputtering, or the like. The seed layer is formed over the insulating layer 122A and over the TMVs 106 (and, if present, conductive connectors 112 of interconnect devices 110) that are exposed by openings in the insulating layer 122A. A photoresist (also not shown) may then be formed to cover the seed layer and then be patterned to expose those portions of the seed layer that are located where the RDL 124A will subsequently be formed. Once the photoresist has been formed and patterned, a conductive material may be formed on the seed layer. The conductive material may be a material such as copper, titanium, tungsten, aluminum, another metal, the like, or a combination thereof. The conductive material may be formed through a deposition process such as electroplating, electroless plating, or the like. However, while the material and methods discussed are suitable to form the conductive material, these are merely examples. Any other suitable materials or any other suitable processes of formation, such as CVD or PVD, may alternatively be used to form the RDL 124A. Once the conductive material has been formed, the photoresist may be removed through a suitable removal process such as an ashing process or a chemical stripping process, such as using oxygen plasma or the like. Additionally, after the removal of the photoresist, those portions of the seed layer that were covered by the photoresist may be removed through, for example, a suitable wet etch process or dry etch process, which may use the conductive material as an etch mask. The remaining portions of the seed layer and conductive material form the RDL 124A. Portions of the RDL 124A extending over the insulating layer 122A may have a thickness of between about 1 µm and about 25 µm in some embodiments, although any suitable thickness may be used.

Additional insulating layers 122B-E/123 and RDLs 124B-G may then be formed over the RDL 124A and insulating layer 122A to provide additional routing along with electrical connection within the redistribution structure 120. The insulating layers 122B-E/123 and RDLs 124B-G may be formed in alternating layers. In some embodiments, the redistribution structure 120 may include different types of insulating layers, such as insulating layers formed from different materials and/or different processes. As an illustrative example, the insulating layers 122B-E shown in FIG. 5 are a different kind of insulating layer than the insulating layer 123. In some embodiments, the insulating layers 122A-E may be formed of a photosensitive polymer and the insulating layer 123 may be formed of a molding compound, but insulating layers 122A-E/123 may be formed of different materials than these in other embodiments. Insulating layer 123 may be formed from a material similar to encapsulant 108, in some embodiments. The redistribution structure 120 may have any number, combination, or arrangement of different types of insulating layers, including those different from the example shown in FIG. 5. For example, the redistribution structure 120 may include multiple insulating layers similar to insulating layer 123, or all of the insulating layers of the redistribution structure 120 may be the same type.

Insulating layers that are similar to insulating layer 122A such as insulating layers 122B-E may be formed using processes and materials similar to those used for the insulating layer 122A. For example, an insulating layer may be formed, and then openings may be formed through the insulating layer to expose portions of the underlying RDL using a suitable photolithographic mask and etching process. A seed layer may be formed over the insulating layer and conductive material may be formed on portions of the seed layer, forming an overlying RDL. These steps may be repeated to form the redistribution structure 120 having a suitable number and configuration of insulation layers and RDLs.

Insulating layer 123 or insulating layers similar to insulating layer 123 may be formed differently than the insulating layers 122A-E. For example, the insulating layer 123 and similar insulating layers may be formed of a molding compound, such as EMC or the like. In some embodiments having an insulating layer formed of a molding compound, vias extending through the insulating layer (e.g., via portions of RDL 124C extending through insulating layer 123) may first be formed on the underlying RDL (e.g., RDL 124B) using a seed layer and plating process in a similar process to that used for forming the TMVs 106, described above. A molding compound may then be deposited over the vias and planarized to expose the vias and form the insulating layer (e.g., insulating layer 123). The insulating layer (e.g., insulating layer 123) may have a thickness between about 1 µm and about 50 µm, such as about 10 µm, although any suitable thickness may be used. Portions of the RDL extending over the insulating layer (e.g., metal line portions of RDL 124C extending over insulating layer 123) may be formed using techniques similar to those used to form RDL 124A, described above. These steps may be repeated to form the redistribution structure 120 having a suitable number and configuration of insulation layers and RDLs.

In some cases, the impedance of interconnects within a redistribution structure such as the redistribution structure 120 can be controlled by forming one or more insulating layers from a different material and/or having a different thickness. For example, by forming an insulating layer (e.g., insulating layer 123) from a molding compound, the impedance of the associated RDL (e.g., RDL 124C) may be controlled according to a specific application or design. Controlling interconnect impedance in this manner can allow more flexibility in the design of a package and can improve operational performance of the package.

Figure 6:
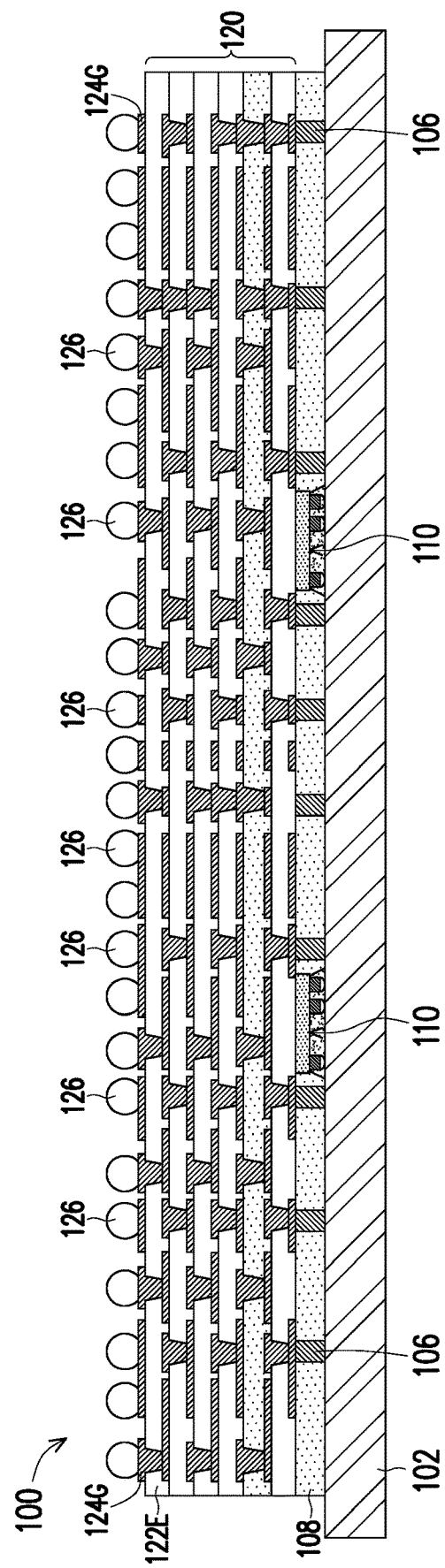
Figure 7A:
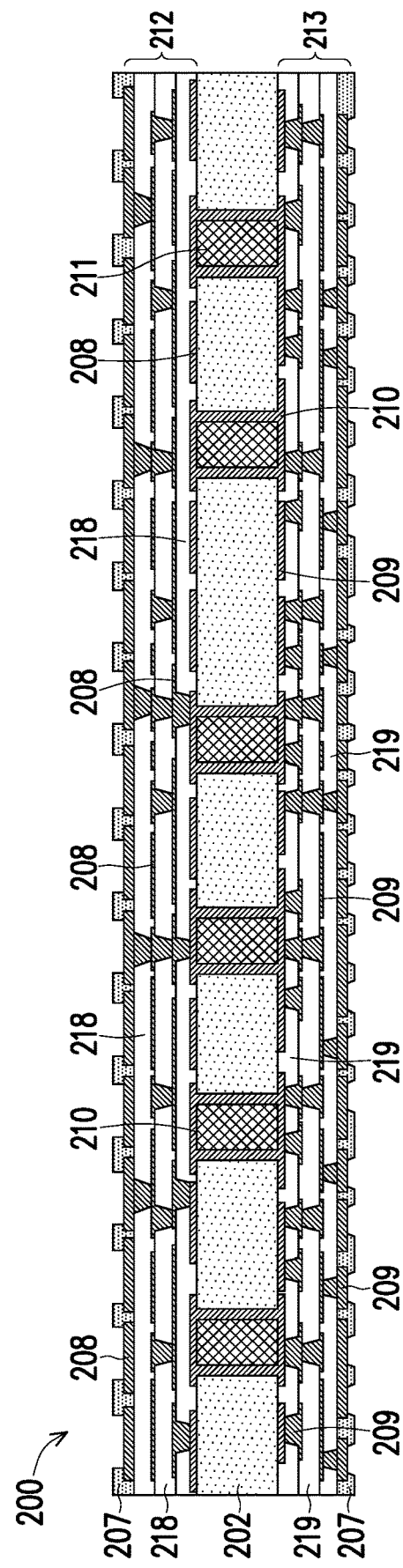
FIGS. 7A-7B illustrate cross-sectional views of intermediate steps of attaching an interconnect structure to a device structure, in accordance with some embodiments.
Figure 7B:
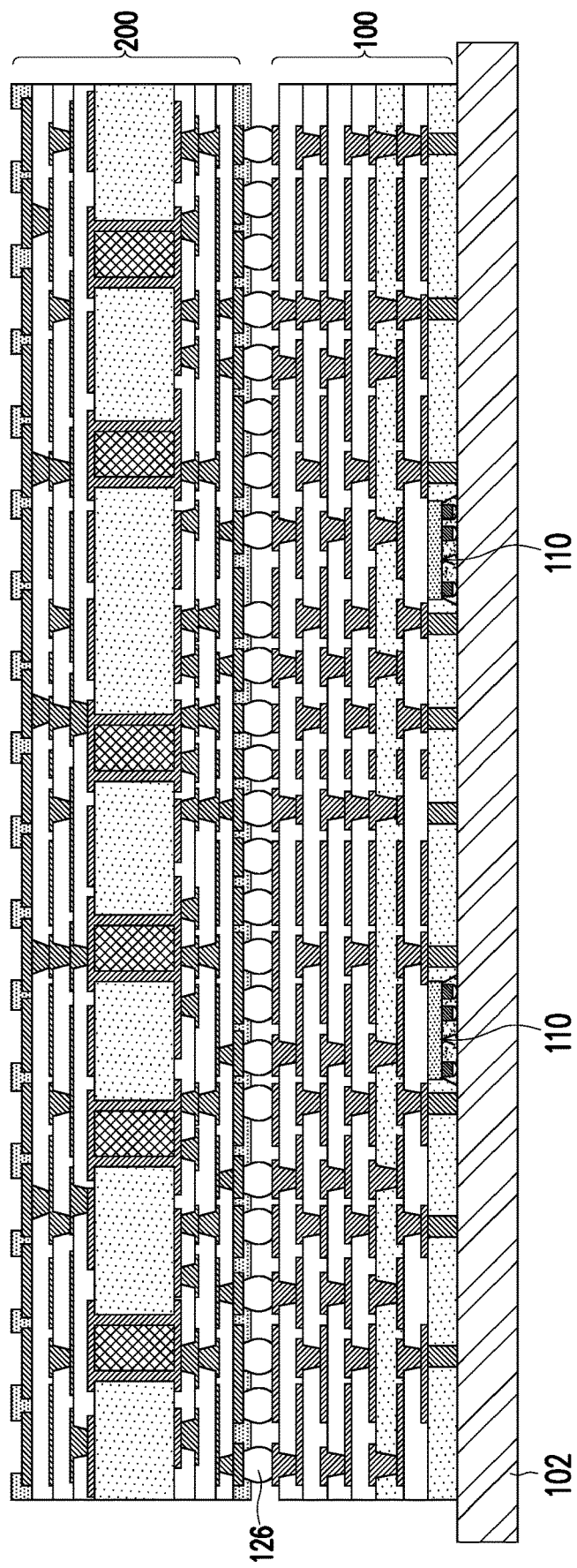

Turning to FIG. 6, external connectors 126 are formed on the redistribution structure 120, forming a device structure 100. In some embodiments, under-bump metallization structures (UBMs, not shown) are first formed on portions of the topmost redistribution layer of the redistribution structure 120 (e.g., redistribution layer 124G in FIG. 6). The UBMs may, for example, include three layers of conductive materials, such as a layer of titanium, a layer of copper, and a layer of nickel. However, other arrangements of materials and layers may be used, such as an arrangement of chrome/chrome-copper alloy/copper/gold, an arrangement of titanium/titanium tungsten/copper, or an arrangement of copper/nickel/gold, that are suitable for the formation of the UBMs. Any suitable materials or layers of material that may be used for the UBMs and are fully intended to be included within the scope of the current application. The UBMs may be created by forming each layer of the UBMs over the redistribution structure 120. The forming of each layer may be performed using a plating process, such as electroplating or electroless plating, although other processes of formation, such as sputtering, evaporation, or PECVD process, may alternatively be used depending upon the desired materials. Once the desired layers have been formed, portions of the layers may then be removed through a suitable photolithographic masking and etching process to remove the undesired material and to leave the UBMs in a desired shape, such as a circular, octagonal, square, or rectangular shape, although any desired shape may alternatively be formed. In some embodiments, the UBMs are formed over the topmost redistribution layer as part of formation of the redistribution structure 120, which may include using the same photolithographic steps used to form the topmost redistribution layer. For example, layers of the UBMs may be deposited over the topmost redistribution layer, and then excess material of the topmost redistribution layer and the UBMs may be removed in the same process. In some embodiments, the UBMs may be part of the topmost redistribution layer of the redistribution structure 120 and may, for example, extend through the topmost insulating layer of the redistribution structure 120 (e.g., insulating layer 122E in FIG. 6).

Still referring to FIG. 6, external connectors 126 are then formed on the topmost redistribution layer of the redistribution structure 120 (e.g., on redistribution layer 124G or on the UBMs, if present). The external connectors 126 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The external connectors 126 may include a conductive material such as solder, copper, aluminum, gold, nickel, silver, palladium, tin, the like, or a combination thereof. In some embodiments, the external connectors 126 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the external connectors 126 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In some embodiments, the pitch of the external connectors 126 may be between about 150 µm and about 1250 µm.

FIGS. 7A-7B illustrate the attachment of an interconnect structure 200 to the device structure 100, in accordance with some embodiments. The interconnect structure 200 provides additional routing and stability to the device structure 100. For example, the interconnect structure 200 can reduce warping of the device structure 100, especially for device structure 100 having large areas (e.g., greater than about 90 mm$^2$).

Turning to FIG. 7A, an interconnect structure 200 is shown in accordance with some embodiments. In some embodiments, the interconnect structure 200 may be, for example, an interposer or a "semi-finished substrate," and may be free of active devices. In some embodiments, interconnect structure may include routing layers formed on a core substrate 202. The core substrate 202 may include a material such as Ajinomoto build-up film (ABF), a pre-impregnated composite fiber (prepreg) material, an epoxy, a molding compound, an epoxy molding compound, fiber-glass-reinforced resin materials, printed circuit board (PCB) materials, silica filler, polymer materials, polyimide materials, paper, glass fiber, non-woven glass fabric, glass, ceramic, other laminates, the like, or combinations thereof. In some embodiments, the core substrate may be a double-sided copper-clad laminate (CCL) substrate or the like. The core substrate 202 may have a thickness between about 30 µm and about 2000 µm, such as about 500 µm or about 1200 µm.

The interconnect structure 200 may have one or more routing structures 212/213 formed on each side of the core substrate 202 and through vias 210 extending through the core substrate 202. The routing structures 212/213 and through vias 210 provide additional electrical routing and interconnection. The routing structures 212/213 may include one or more routing layers 208/209 and one or more dielectric layers 218/219. In some embodiments, the routing layers 208/209 and/or through vias 210 may comprise one or more layers of copper, nickel, aluminum, other conductive materials, the like, or a combination thereof. In some embodiments, the dielectric layers 218/219 may be include materials such as a build-up material, ABF, a prepreg material, a laminate material, another material similar to those described above for the core substrate 202, the like, or combinations thereof. The interconnect structure 200 shown in FIG. 7A shows two routing structures having a total of six routing layers, but more or fewer routing layers may be formed on either side of the core substrate 202 in other embodiments.

In some embodiments, the openings in the core substrate 202 for the through vias 210 may be filled with a filler material 211. The filler material 211 may provide structural support and protection for the conductive material of the through via 210. In some embodiments, the filler material 211 may be a material such as a molding material, epoxy, an epoxy molding compound, a resin, materials including monomers or oligomers, such as acrylated urethanes, rubber-modified acrylated epoxy resins, or multifunctional monomers, the like, or a combination thereof. In some embodiments, the filler material 211 may include pigments or dyes (e.g., for color), or other fillers and additives that modify rheology, improve adhesion, or affect other properties of the filler material 211. In some embodiments, the conductive material of the through vias 210 may completely fill the through vias 210, omitting the filler material 211.

In some embodiments, the interconnect structure 200 may include a passivation layer 207 formed over one or more sides of the interconnect structure 200. The passivation layer 207 may be a material such as a nitride, an oxide, a polyimide, a low-temp polyimide, a solder resist, combinations thereof, or the like. Once formed, the passivation layer 207 may be patterned (e.g., using a suitable photolithographic and etching process) to expose portions of the routing layers 208/209 of the routing structures 212/213.

FIG. 7B illustrates a placement of the interconnect structure 200 into electrical connection with the device structure 100, in accordance with some embodiments. In an embodiment, the interconnect structure 200 are placed into physical contact with the external connectors 126 on the device structure 100 using, e.g., a pick and place process. The interconnect structure 200 may be placed such that exposed regions of the topmost routing layer of a routing structure (e.g., routing structure 213) are aligned with corresponding external connectors 126 of the device structure 100. Once in physical contact, a reflow process may be utilized to bond the external connectors 126 of the device structure 100 to the interconnect structure 200. In some embodiments, external connectors are formed on the interconnect structure 200 instead of or in addition to the external connectors 126 formed on the device structure 100. In some embodiments, external connectors 126 are not formed on the device structure 100, and the interconnect structure 200 is bonded to the device structure 100 using a direct bonding technique such as a thermocompression bonding technique.

Figure 8:
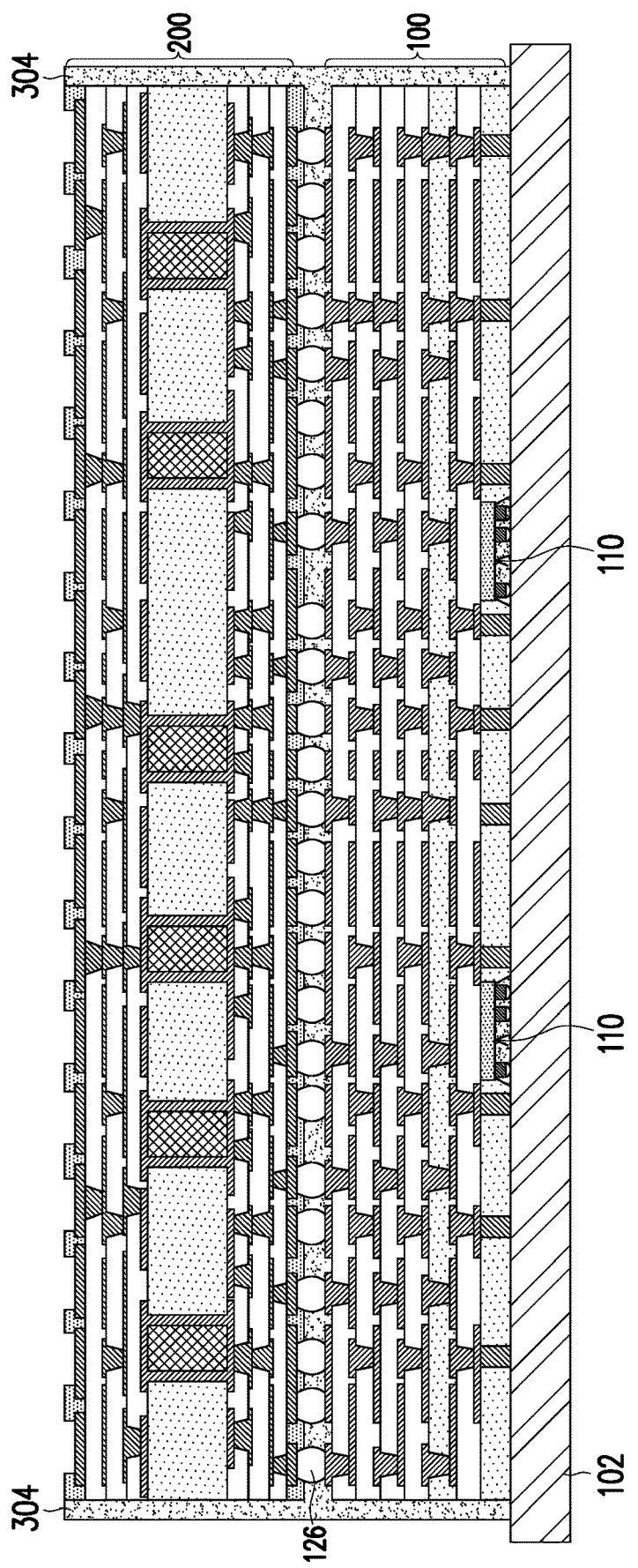
FIGS. 8 through 13 illustrate cross-sectional views of intermediate steps of forming a package, in accordance with some embodiments.

In FIG. 8, an underfill 304 is deposited along the sidewalls of the interconnect structure 200 and in the gap between the interconnect structure 200 and the device structure 100. The underfill 304 may be a material such as a molding compound, an epoxy, an underfill, a molding underfill (MUF), a resin, or the like. The underfill 304 can protect the external connectors 126 and provide structural support for the device structure 100. In some embodiments, the underfill 304 may be cured after deposition. In some embodiments, the underfill 304 may be thinned after deposition. The thinning may be performed, e.g., using a mechanical grinding or CMP process. In some embodiments, the underfill 304 may be deposited over the routing structure 212, and the thinning may expose the topmost routing layer of the routing structure 212.

Figure 9:
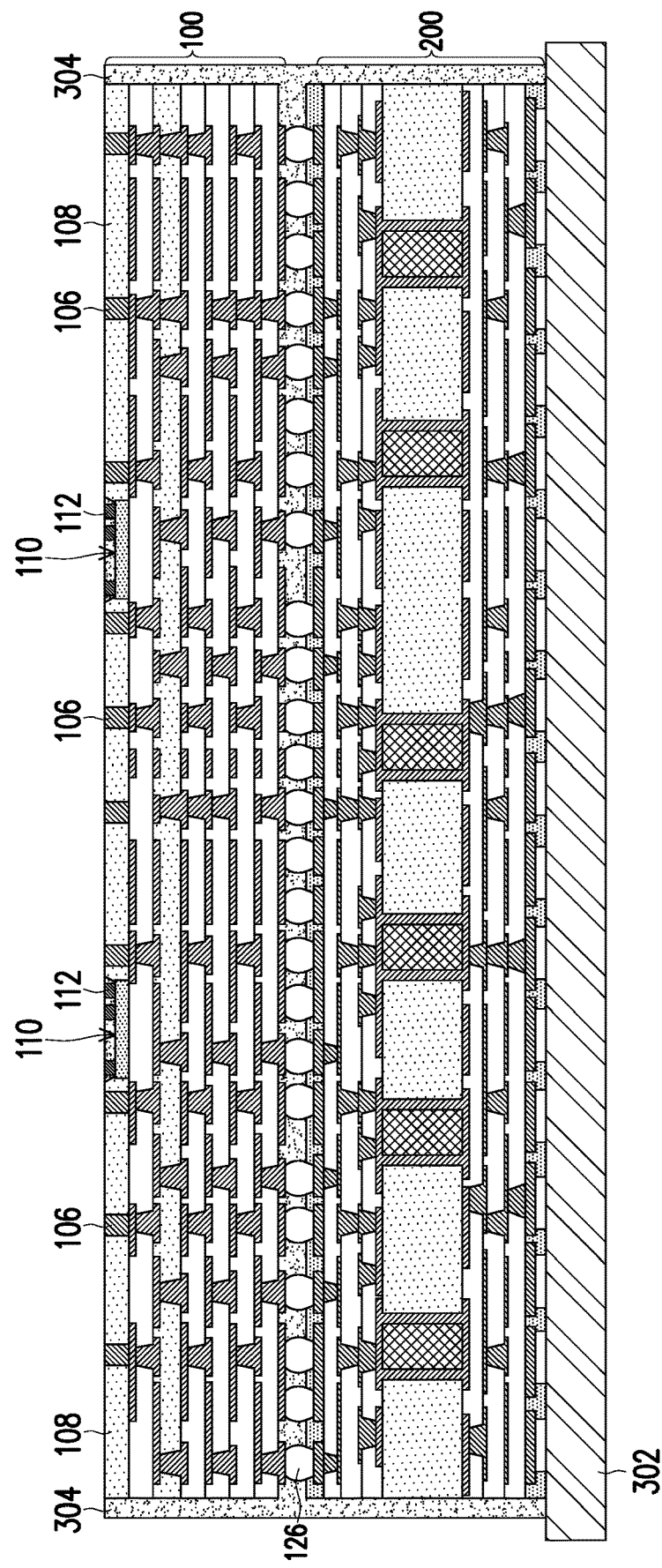

Turning to FIG. 9, the first carrier substrate 102 is de-bonded to detach (or "de bond") the first carrier substrate 102. The structure is then flipped over and bonded to a second carrier substrate 302, in accordance with some embodiments. In some embodiments, the de-bonding includes projecting a light such as a laser light or an UV light on a release layer on the first carrier substrate 102 so that the release layer decomposes under the heat of the light and the first carrier substrate 102 can be removed. The second carrier substrate 302 may be a carrier substrate similar to those described above for the first carrier substrate 102. For example, the second carrier substrate 302 may be a wafer similar to that shown in FIG. 18A or a panel similar to that shown in FIG. 18B. The different types of second carrier substrates 302 may also be used to form multiple packages 300 (see FIG. 13). The structures formed on the second carrier substrate 302 may be subsequently singulated to form individual packages 300. A release layer (not shown) may be formed on the second carrier substrate 302 to facilitate attachment of the structure to the second carrier substrate 302.

As shown in FIG. 9, a side of the interconnect structure 200 is attached to the second carrier substrate 302. After attachment, a planarization process (e.g., a grinding process or a CMP process) may be performed on the device structure 100. The planarization process may remove portions of the encapsulant 108, and may also remove remaining portions of seed layer 104 and/or solder material 114. In this manner, the planarization process may expose the TMVs 106 and the conductive connectors 112 (or the solder material 114) of the interconnect devices 110. An embodiment in which the solder material 114 is fully removed by the planarization process is shown below in FIG. 15A, and an embodiment in which the solder material 114 is exposed by the planarization process is shown below in FIG. 15B.

Figure 10:
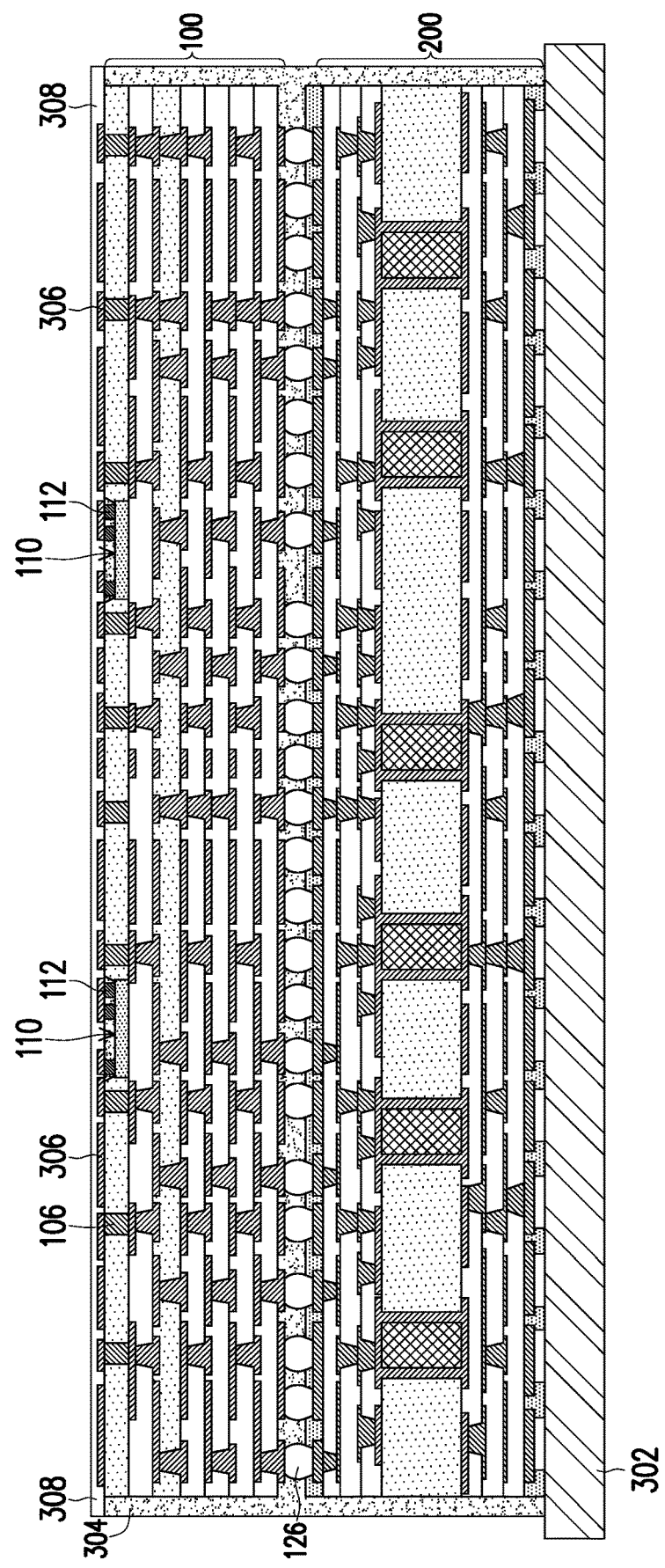

Turning to FIG. 10, an RDL 306 and a protective layer 308 are formed over the structure, in accordance with some embodiments. The RDL 306 may be, for example, a metallization pattern comprising conductive lines that electrically connect the interconnect devices 110 and the redistribution structure 120 to external devices such as the semiconductor devices 320A-C described in FIG. 12. In some embodiments, the RDL 306 may be formed using materials and processes similar to the RDLs 124A-G of redistribution structure 120. For example, a seed layer may be formed, and a photoresist may be formed and patterned on top of the seed layer in a desired pattern for the RDL 306. The photoresist may be patterned to expose the TMVs 106 and the conductive connectors 112 of the interconnect devices 110. Conductive material may then be formed in the patterned openings of the photoresist using e.g., a plating process. The photoresist may then be removed and the seed layer may be removed by etching, forming the RDL 306. In this manner, the RDL 306 may make electrical connections between the TMVs 106 and the conductive connectors 112 of the interconnect devices 110.

After forming the RDL 306, the protective layer 308 may be formed over the structure, covering the RDL 306. The protective layer 308 may be formed from one or more suitable dielectric materials such as polybenzoxazole (PBO), a polymer material, a polyimide material, a polyimide derivative, an oxide, a nitride, a molding compound, the like, or a combination thereof. The protective layer 308 may be formed by spin coating, lamination, CVD, the like, or a combination thereof. In some embodiments, the protective layer 308 may have a thickness between about 2 μm and about 50 μm.

Figure 11:
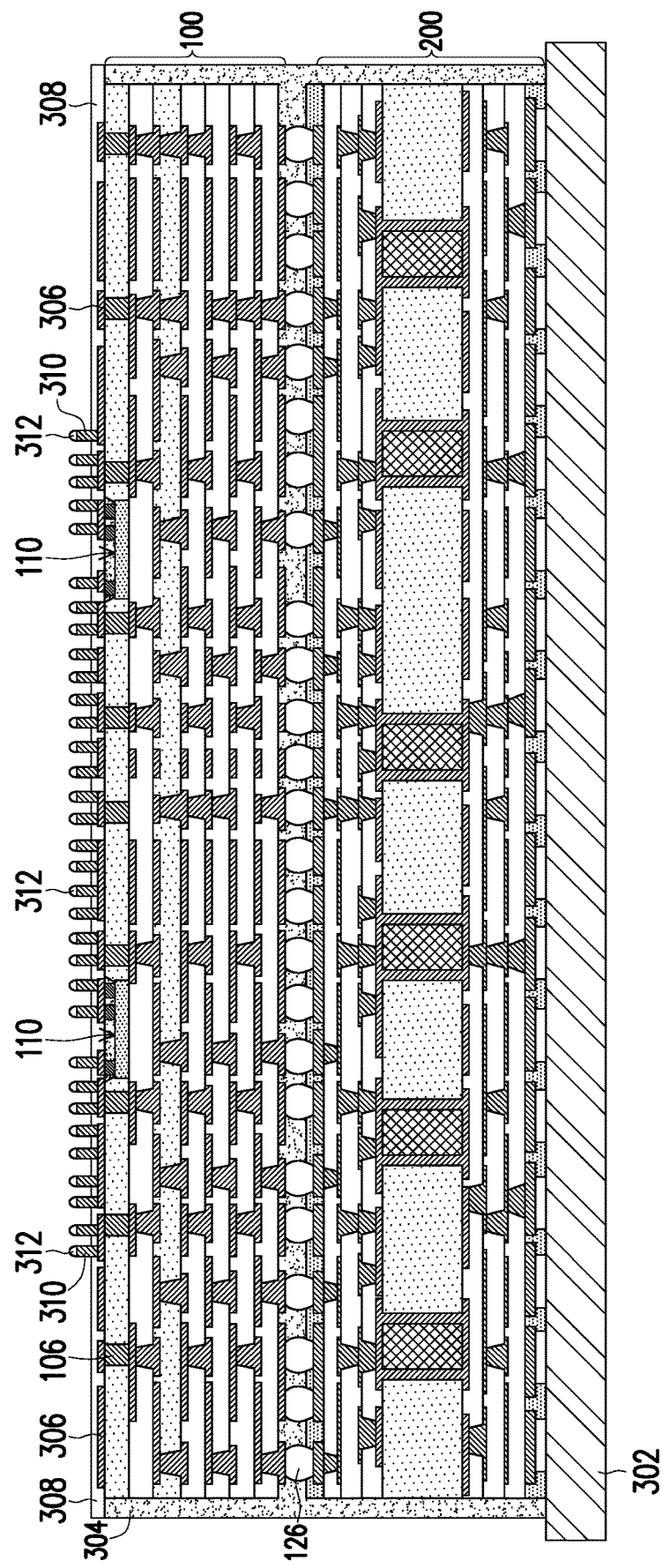

Turning to FIG. 11, under-bump metallizations (UBMs) 310 and external connectors 312 are formed on the structure, in accordance with some embodiments. The UBMs 310 extend through the protective layer 308 and form electrical connections with the RDL 306. In some embodiments, the UBMs 310 may be formed by, for example, forming openings in the protective layer 308 and then forming the conductive material of the UBMs 310 over the protective layer 308 and within the openings in the protective layer

308. In some embodiments, the openings in the protective layer 308 may be formed by forming a photoresist over the protective layer 308, patterning the photoresist, and etching the protective layer 308 through the patterned photoresist using a suitable etching process (e.g., a wet etching process and/or a dry etching process).

In some embodiments, the UBMs 310 include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the UBMs 310. Any suitable materials or layers of material that may be used for the UBMs 310 are fully intended to be included within the scope of the current application. The conductive material (e.g., the layers) of the UBMs 310 may be formed using one or more plating processes, such as electroplating or electroless plating processes, although other processes of formation, such as sputtering, evaporation, or a PECVD process, may alternatively be used. Once the conductive material of the UBMs 310 has been formed, portions of the conductive material may then be removed through a suitable photolithographic masking and etching process to remove the undesired material. The remaining conductive material forms the UBMs 310. In some embodiments, the UBMs 310 may have a pitch between about 20 μm and about 80 μm.

Still referring to FIG. 11, external connectors 312 are formed over the UBMs 310, in accordance with some embodiments. In some embodiments, the external connectors 312 may be ball grid array (BGA) connectors, solder balls, controlled collapse chip connection (C4) bumps, micro bumps (e.g., μ bumps), electroless nickel-electroless palladium-immersion gold technique (ENEPIG) formed bumps, or the like. The external connectors 312 may include a conductive material such as solder, copper, aluminum, gold, nickel, silver, palladium, tin, the like, or a combination thereof. In some embodiments, the UBMs 310 are formed by initially forming a layer of solder through evaporation, electroplating, printing, solder transfer, ball placement, or the like. Once a layer of solder has been formed on the external connectors 312, a reflow may be performed in order to shape the material into the desired shapes.

Figure 12:
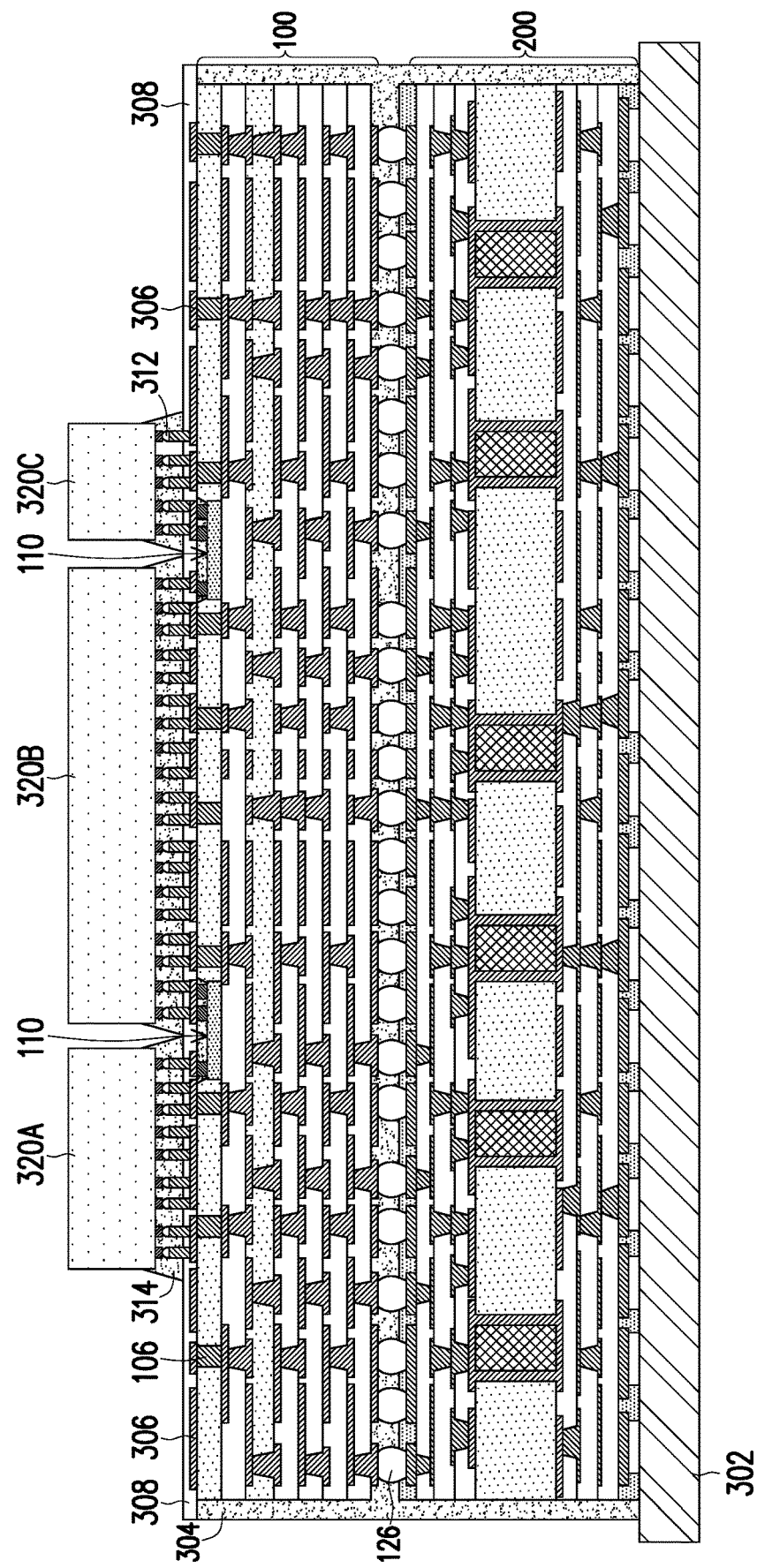

FIG. 12 illustrates the attachment of semiconductor devices 320A-C to the external connectors 312, in accordance with some embodiments. The semiconductor devices 320A-C are physically and electrically connected to the external connectors 312 to make electrical connection between the semiconductor devices 320A-C and the RDL 306. In this manner, the semiconductor devices 320A-C also make electrical connection to the interconnect devices 110 and/or the TMVs 106. The semiconductor devices 320A-C may be placed on the external connectors 312 using a suitable process such as a pick-and-place process.

In some cases, the semiconductor devices 320A-C are at least partially connected to each other by the interconnect devices 110. By forming the interconnect devices 110 in a layer of the device structure 100 close to the semiconductor devices 320A-C as described herein, the routing distances of connections between the semiconductor devices 320A-C may be reduced, which can increase the bandwidth or speed of electrical signals communicated between the semiconductor devices 320A-C, improving high-speed operation. Additionally, the greater routing density available in the interconnect devices 110 can provide more efficient routing between semiconductor devices 320A-C, and in some cases can reduce the number of RDLs used in the redistribution structure 120 or the number of routing layers used in the interconnect structure 200. In some cases, the integrity or stability of the power supplied to the semiconductor devices 320A-C may be improved by connecting the semiconductor devices to the RDL 306 through a protective layer 308 that is relatively thin (e.g., compared to the insulating layers of the redistribution structure 120, for instance).

Additionally, in some cases, attaching the semiconductor devices 320A-C to a device structure 100 rather than to an interconnect structure (e.g., interconnect structure 200, an organic core substrate, substrate with additional routing, or the like) can reduce warpage, for example, due to coefficient of thermal expansion (CTE) mismatch. The use of interconnect devices 110 to interconnect the semiconductor devices 320A-C rather than interconnecting the semiconductor devices 320A-C using a separate interconnect structure allows the semiconductor devices 320A-C to be directly attached to the device structure 100, which can reduce the overall size of the structure as well as reduce warping. The use of interconnect devices 110 can also provide electrical routing with reduced warping due to improved CTE matching with the semiconductor devices 320A-C. This can reduce the risk of contact fatigue issues for electrical connections to the semiconductor devices 320A-C, particularly for semiconductor devices 320A-C or packages having larger areas. Reducing warping can also reduce alignment mismatch when attaching the semiconductor devices 320A-C.

In accordance with some embodiments, one or more of the semiconductor devices 320A-C may include devices designed for an intended purpose such as a memory die (e.g., a DRAM die, a stacked memory die, a high-bandwidth memory (HBM) die, etc.), a logic die, a central processing unit (CPU) die, an I/O die, a system-on-a-chip (SoC), a component on a wafer (CoW), an integrated fan-out structure (InFO), a package, the like, or a combination thereof. In some embodiments, one or more of the semiconductor devices 320A-C includes integrated circuit devices, such as transistors, capacitors, inductors, resistors, metallization layers, external connectors, and the like, therein, as desired for a particular functionality. FIG. 12 shows the attachment of three semiconductor devices, but in other embodiments, one, two, or more than three semiconductor devices may be attached to the external connectors 312. In some embodiments, the semiconductor devices attached to the external connectors 312 may include more than one of the same type of semiconductor device or may include two or more different types of semiconductor devices.

The semiconductor devices 320A-C may be placed such that conductive regions of the semiconductor devices 320A-C (e.g., contact pads, conductive connectors, solder bumps, or the like) are aligned with corresponding external connectors 312. Once in physical contact, a reflow process may be utilized to bond the external connectors 312 to the semiconductor devices 320A-C. As shown in FIG. 12, an underfill 314 may be deposited between each of the semiconductor devices 320A-C and the protective layer 308. The underfill 314 may also at least partially surround external connectors 312 or UBMs 310. The underfill 314 may be a material such as a molding compound, an epoxy, an underfill, a molding underfill (MUF), a resin, or the like, and may be similar to underfill 304 or underfill 107 described previously.

Figure 13:
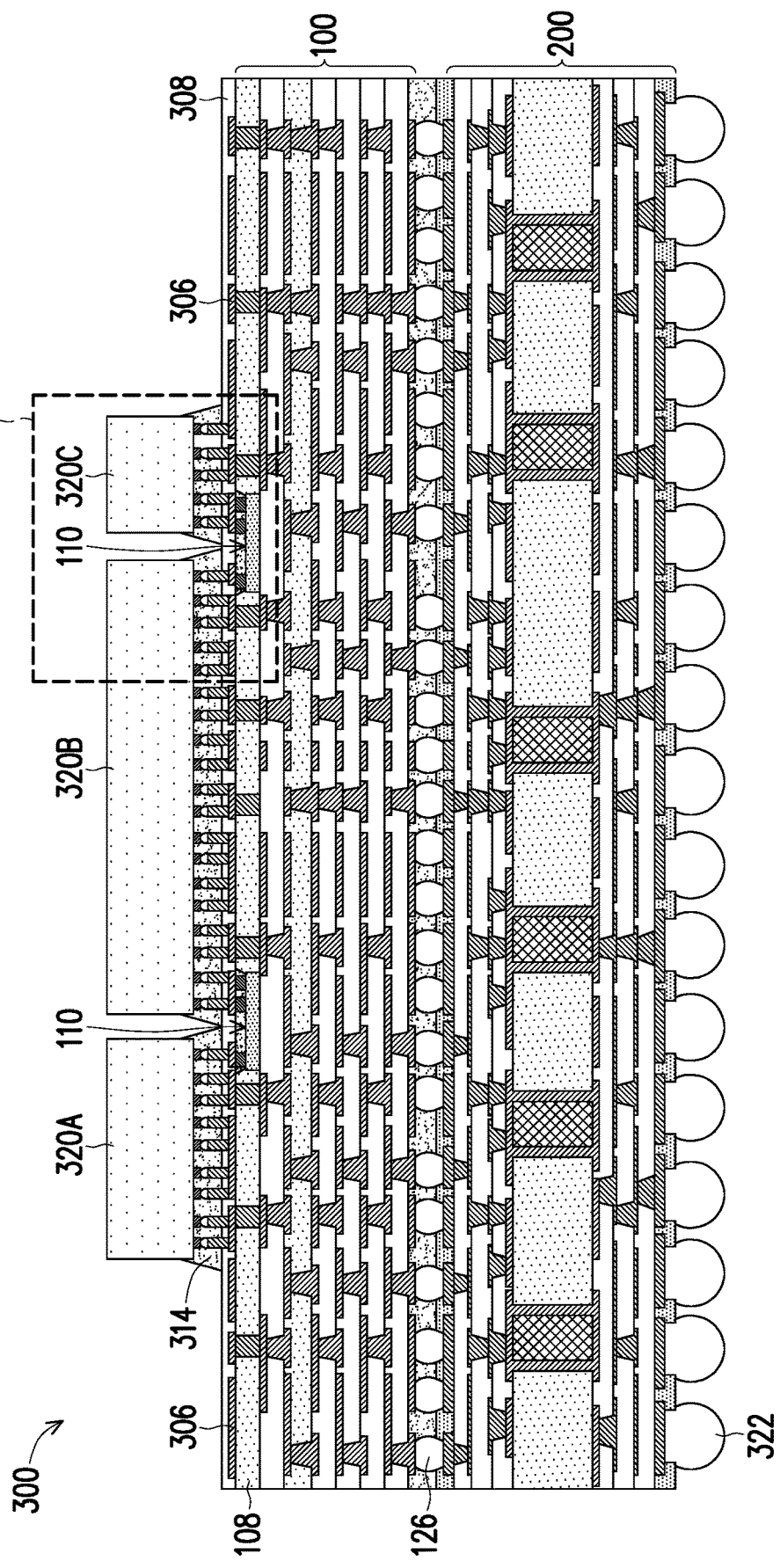
Figure 14:
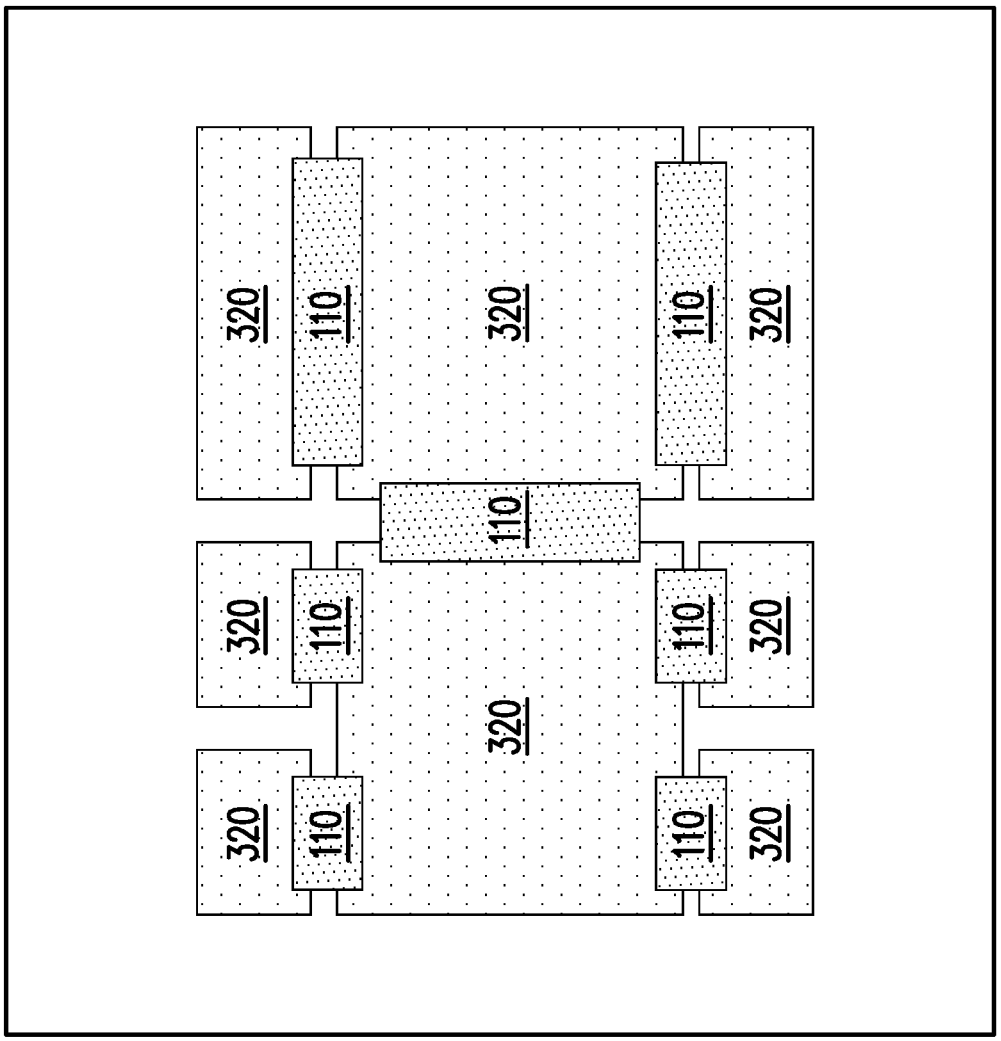
FIG. 14 illustrates a plan view of a package, in accordance with some embodiments.

Turning to FIG. 13, the second carrier substrate 302 is de-bonded and external connectors 322 are formed on the interconnect structure 200 to form a package 300, in accordance with some embodiments. In some embodiments, the de-bonding includes projecting a light such as a laser light or an UV light on a release layer on the second carrier substrate 302 so that the release layer decomposes under the heat of the light and the second carrier substrate 302 can be removed. In some embodiments, multiple packages 300 are formed on the second carrier substrate 302 and then singulated to form separate packages 300.

Still referring to FIG. 13, the external connectors 322 may be formed on exposed portions of the topmost routing layer of the interconnect structure 200. In some embodiments, UBMs are formed on the interconnect structure 200, and the external connectors 322 are formed over the UBMs. The external connectors 322 may be, for example, contact bumps or solder balls, although any suitable types of connectors may be utilized. In an embodiment in which the external connectors 322 are contact bumps, the external connectors 322 may include a material such as tin, or other suitable materials, such as silver, lead-free tin, or copper. In an embodiment in which the external connectors 322 are solder bumps, the external connectors 322 may be formed by initially forming a layer of solder using such a technique such as evaporation, electroplating, printing, solder transfer, ball placement, etc. Once a layer of solder has been formed on the structure, a reflow may be performed in order to shape the material into the desired bump shape for the external connectors 322. In some embodiments, the external connectors 322 may be similar to external connectors 126 described above with respect to FIG. 6. In this manner, a package 300 comprising interconnect devices 110 may be formed.

Turning to FIG. 14, an illustrative plan view of a package 350 is shown, in accordance with some embodiments. The package 350 shown in FIG. 14 is an illustrative example, and may be similar to the package 300 shown in FIG. 13. For example, the package 350 includes interconnect devices 110 and semiconductor devices 320, which may be similar to the semiconductor devices 320A-C described in FIG. 12. Some features of the package 350 shown in FIG. 14 have been omitted for clarity. As shown in FIG. 14, the interconnect devices 110 may be located in regions between adjacent semiconductor devices 320. In this manner, the interconnect devices 110 are configured to provide electrical connections between the adjacent semiconductor devices 320. The package 350 shown in FIG. 14 is an illustrative example, and the semiconductor devices 320 or interconnect devices 110 may have different sizes, shapes, arrangements, or configurations than shown or be present in different numbers than shown.

Figure 15B:
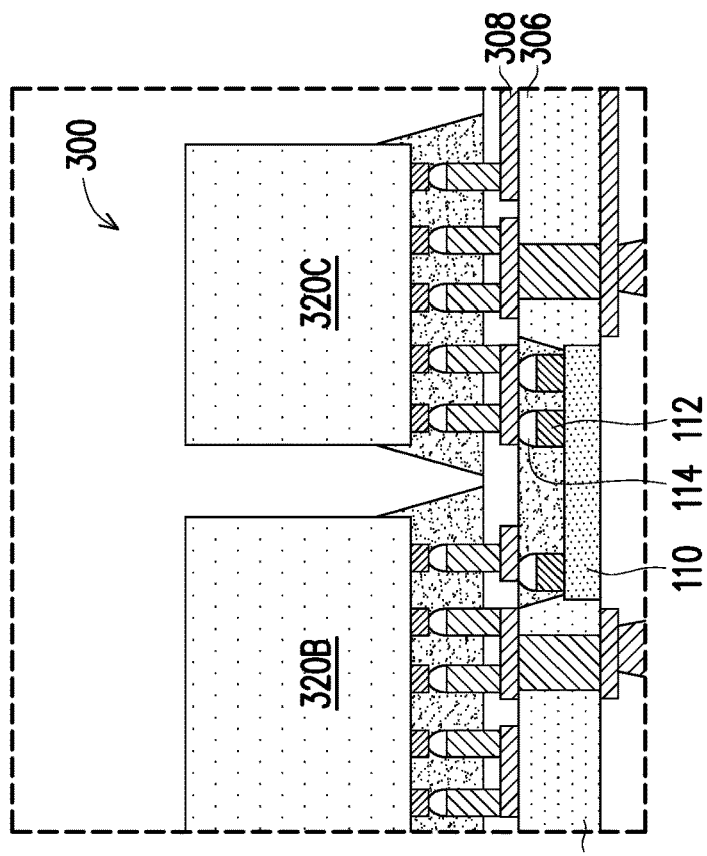
FIGS. 15A and 15B illustrate cross-sectional views of portions of packages, in accordance with some embodiments.
Figure 15A:
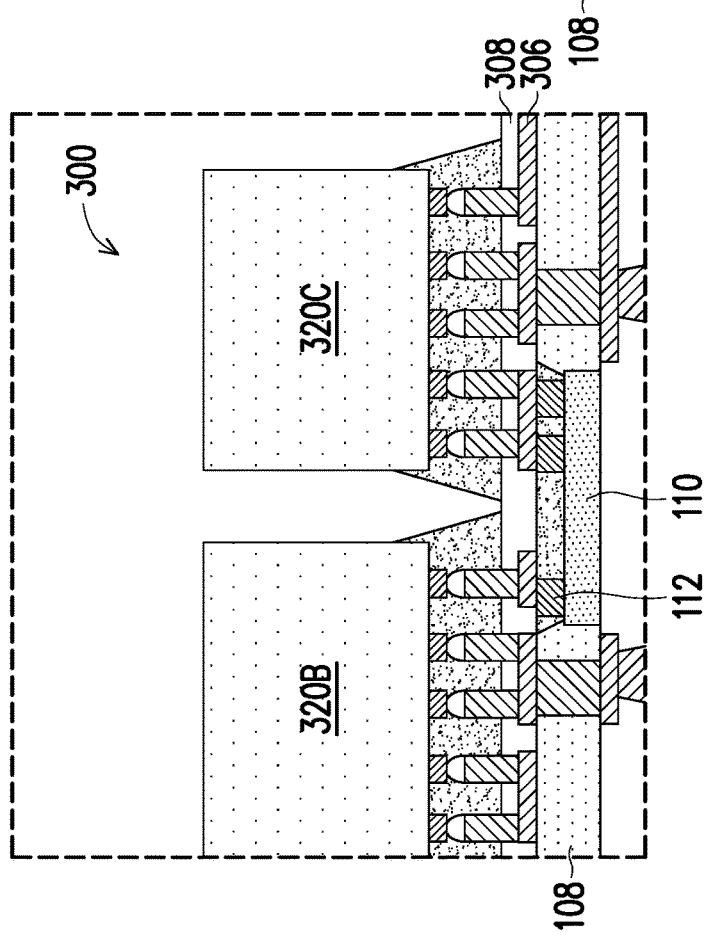

FIGS. 15A-15B show magnified cross-sectional views of packages 300, in accordance with some embodiments. The region shown in the cross-sectional views of FIGS. 15A and 15B is approximately the correspondingly labeled region indicated in FIG. 13. The package 300 shown in FIG. 15A is similar to the package 300 shown in FIG. 13, in which all of the solder material 114 is removed by the planarization process described previously for FIG. 9. As shown in FIG. 15A, the RDL 306 is thus formed on the conductive connectors 112 of the interconnect devices 110. The package 300 shown in FIG. 15B is similar to the package 300 shown in FIG. 13, except that the solder material 114 is not removed by the planarization process described previously for FIG. 9, but is only exposed by the planarization process. As shown in FIG. 15B, the RDL 306 is thus formed on the solder material 114 of the interconnect devices 110.

FIG. 16 shows a package 400 that includes interconnect devices 110 and electronic devices 410, in accordance with some embodiments. The package 400 may be similar to the package 300 shown in FIG. 13, except that electronic devices 410 are formed in the device structure 100 in addition to interconnect devices 110. Similar to the interconnect devices 110, the electronic devices 410 may be electrically connected to the semiconductor devices 320A-C and/or the redistribution structure 120 of the device structure 100. One electronic device 410 is shown in FIG. 16, but multiple electronic devices 410 may be present in other embodiments. The multiple electronic devices may include similar electronic devices 410 and/or different electronic devices 410. The electronic devices 410 may be formed in the device structure 100 by placing them on the first carrier substrate 102 in a similar manner as the interconnect devices 110, described above in FIG. 2. The package 400 may be subsequently formed in a similar manner as the package 300.

The electronic devices 410 may be, for example, a die (e.g., an integrated circuit die, power integrated circuit die, logic die, or the like), a chip, a semiconductor device, a memory device (e.g., SRAM or the like), a passive device (e.g., an integrated passive device (IPD), a multi-layer ceramic capacitor (MLCC), an integrated voltage regulator (IVR), or the like), the like, or a combination thereof. The electronic device 410 may comprise one or more active devices such as transistors, diodes, or the like and/or one or more passive devices such as capacitors, resistors, inductors, or the like. In this manner, different electronic devices 410 can be implemented in a package, providing additional functionality and performance benefits. For example, by incorporating electronic devices 410 such as IPDs or IVRs that are coupled to the power routing of the package 400, the stability of the power supplied to the semiconductor devices 320A-C can be improved. In some embodiments, the electronic devices 410 may also provide additional routing between semiconductor devices 320A-C, similar to that provided by interconnect devices 110.

Turning to FIG. 17, an illustrative plan view of a package 450 is shown, in accordance with some embodiments. The package 450 shown in FIG. 17 is an illustrative example, and may be similar to the package 400 shown in FIG. 16. For example, the package 450 includes interconnect devices 110, electronic devices 410, and semiconductor devices 320, which may be similar to the semiconductor devices 320A-C described in FIG. 12. In this manner, the interconnect devices 110 may provide additional routing and the electronic devices 410 may provide additional functionality (e.g., as additional active and/or passive devices). Some features of the package 450 shown in FIG. 17 have been omitted for clarity. As shown in FIG. 17, the interconnect devices 110 may be located in regions between adjacent semiconductor devices 320. The electronic devices 410 may be located in regions between adjacent semiconductor devices 320 and/or in other regions, such as regions beneath the semiconductor devices 320. In this manner, the design of a package including electronic devices 410 is flexible, for example, the electronic devices 410 may be located in regions suitable for their functionality. The package 450 shown in FIG. 17 is an illustrative example, and the semiconductor devices 320, interconnect devices 110, or electronic devices 410 may have different sizes, shapes, arrangements, or configurations than shown or be present in different numbers than shown.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

By utilizing the embodiments described herein, the performance of a device package may be improved, and the reliability of a device package may be improved. Different features of embodiments described herein may be combined to achieve these and other benefits. In some cases, the use of interconnect devices to connect semiconductor devices as described may improve the conduction and reliability of electrical connections between semiconductor devices, and allow for improved bandwidth during high-speed operation. In some cases, the techniques described herein may be performed in a process flow with other typical fabrication processes, and thus may add little or no additional cost to existing processes. Additionally, using process techniques as described may result in improved yield and improved connection reliability, especially for packages having larger areas. For example, the process techniques described herein may reduce warpage. In some cases, electronic devices can be incorporated in a package in addition to interconnect devices, which can provide additional functionality. For example, electronic devices comprising IPDs or IVRs can improve power integrity of a package.

In some embodiments, a method includes placing an interconnect device on a first carrier, wherein the interconnect device includes a first conductive connector and a second conductive connector, forming a first via and a second via on the first carrier, forming a redistribution structure over the interconnect device, the first via, and the second via, wherein a first side of the redistribution structure is connected to the first via and the second via, connecting an interconnect structure to a second side of the redistribution structure wherein the interconnect structure includes an organic substrate and routing layers, attaching the interconnect structure to a second carrier, connecting a first semiconductor die to the first conductive connector of the interconnect device and the first via, and connecting a second semiconductor die to the second conductive connector of the interconnect device and the second via, wherein the second semiconductor die is electrically connected to the first semiconductor die through the interconnect device. In an embodiment, the method includes forming a molding compound over the first carrier, the molding compound surrounding the interconnect device, the first via, and the second via. In an embodiment, the method includes placing an integrated voltage regulator (IVR) die on the first carrier and includes connecting the first semiconductor die to the IVR. In an embodiment, the method includes forming a seed layer on the first carrier and performing a reflow process to bond the first conductive connector and the second conductive connector to the seed layer. In an embodiment, the first semiconductor die extends over the interconnect device, and the second semiconductor die extends over the interconnect device. In an embodiment, the method includes forming an underfill between the interconnect device and the first carrier. In an embodiment, forming the redistribution structure includes forming a layer of molding compound and a redistribution layer extending through the layer of molding compound. In an embodiment, the method includes forming a metallization pattern over the interconnect device, the first via, and the second via, wherein the metallization pattern is between the first semiconductor die and the interconnect device. In an embodiment, the method includes forming a protective layer over the metallization pattern. In an embodiment, the method includes forming external connectors extending through the protective layer and contacting the metallization pattern, wherein the first semiconductor die is electrically connected to the external connectors.

In an embodiment, a device includes an interconnect device attached to a redistribution structure, wherein the interconnect device includes conductive routing connected to conductive connectors disposed on a first side of the interconnect device, a molding material at least laterally surrounding the interconnect device, a metallization pattern over the molding material and the first side of the interconnect device, wherein the metallization pattern is electrically connected to the conductive connectors, first external connectors connected to the metallization pattern, and semiconductor devices connected to the first external connectors. In an embodiment, the conductive routing of the interconnect device has a pitch less than 1 μm. In an embodiment, the device includes an integrated passive device (IPD) attached to the redistribution structure, the molding material at least laterally surrounding the IPD. In an embodiment, the device includes second external connectors on the redistribution structure and an interconnect structure attached to the second external connectors. In an embodiment, the device includes an underfill extending between the redistribution structure and the interconnect structure. In an embodiment, the device includes an insulating layer over the metallization pattern, wherein the first external connectors extend through the insulating layer.

In an embodiment, a package includes a redistribution structure including insulating layers and redistribution layers, a first layer of molding compound on the redistribution structure, vias within the first layer of molding compound, interconnect devices within the first layer of molding compound, wherein each interconnect device includes contacts, a dielectric layer covering the first layer of molding compound, the vias, and the interconnect devices, and semiconductor devices over the dielectric layer, wherein the semiconductor devices are electrically connected to the vias through the dielectric layer and are electrically connected to the contacts of the interconnect devices through the dielectric layer, wherein at least two semiconductor devices of the semiconductor devices are electrically connected through at least one interconnect device of the interconnect devices. In an embodiment, the package includes an interconnect structure electrically connected to the redistribution structure, the interconnect structure comprising a routing structure formed over a substrate and an underfill material extending between the redistribution structure and the interconnect structure. In an embodiment, the package includes an integrated passive device (IPD) within the first layer of molding compound, wherein the IPD is electrically connected to at least one semiconductor device of the semiconductor devices. In an embodiment, an insulating layer of the insulating layers of the redistribution structure includes a second layer of molding compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
attaching an interconnect device to a top surface of a first carrier, wherein the interconnect device comprises a first conductive connector and a second conductive connector;
forming a first via and a second via on the top surface of the first carrier;
after attaching the interconnect device, forming a redistribution structure over the interconnect device, the first via, and the second via, wherein a first side of the redistribution structure is connected to the first via and the second via;
connecting an interconnect structure to a second side of the redistribution structure wherein the interconnect structure comprises an organic substrate and a plurality of routing layers;
attaching the interconnect structure to a second carrier;
connecting a first semiconductor die to the first conductive connector of the interconnect device and the first via;
connecting a second semiconductor die to the second conductive connector of the interconnect device and the second via, wherein the second semiconductor die is electrically connected to the first semiconductor die through the interconnect device; and
removing the second carrier.

2. The method of claim 1, further comprising forming a molding compound over the first carrier, the molding compound surrounding the interconnect device, the first via, and the second via.

3. The method of claim 1, further comprising placing an integrated voltage regulator (IVR) die on the first carrier, and further comprising connecting the first semiconductor die to the IVR.

4. The method of claim 1, further comprising forming a seed layer on the first carrier and performing a reflow process to bond the first conductive connector and the second conductive connector to the seed layer.

5. The method of claim 1, wherein the first semiconductor die extends over the interconnect device, and wherein the second semiconductor die extends over the interconnect device.

6. The method of claim 1, further comprising forming an underfill between the interconnect device and the first carrier.

7. The method of claim 1, wherein forming the redistribution structure comprises forming a layer of molding compound and a redistribution layer extending through the layer of molding compound.

8. The method of claim 1, further comprising forming a metallization pattern over the interconnect device, the first via, and the second via, wherein the metallization pattern is between the first semiconductor die and the interconnect device.

9. The method of claim 1, wherein the interconnect device is between the redistribution structure and the first carrier.

10. A method comprising:
forming an interconnect device, wherein the interconnect device comprises conductive routing connected to a plurality of conductive connectors disposed on a first side of the interconnect device;
encapsulating the interconnect device with an encapsulant, wherein a second side of the interconnect device and a surface of the encapsulant are level;
after encapsulating the interconnect device, forming a redistribution structure on the encapsulant and on the second side of the interconnect device;
connecting an interconnect structure to the redistribution structure;
forming a metallization layer on the encapsulant and the first side of the interconnect device, wherein the metallization layer electrically contacts the plurality of conductive connectors; and
connecting a plurality of semiconductor devices to the metallization layer, wherein at least two semiconductor devices of the plurality of semiconductor devices are electrically connected to the interconnect device through the metallization layer.

11. The method of claim 10, wherein before connecting the interconnect structure to the redistribution structure, the interconnect device is electrically isolated from the redistribution structure.

12. The method of claim 10, further comprising forming through-vias penetrating through the encapsulant, wherein the through-vias are electrically connected to the metallization layer and to the redistribution structure.

13. The method of claim 10, wherein the interconnect device comprises an integrated passive device (IPD).

14. The method of claim 10 further comprising forming an insulating layer over the metallization layer and the encapsulant, wherein the insulating layer is a different material than the encapsulant.

15. The method of claim 14 further comprising forming vias penetrating through the insulating layer, wherein the vias are electrically connected to the metallization layer and to the plurality of semiconductor devices.

16. The method of claim 10 further comprising performing a planarization process on the encapsulant to expose the interconnect device.

17. A method comprising:
forming a redistribution structure comprising:
a plurality of insulating layers and a plurality of redistribution layers;
an interconnect device in a first insulating layer of the plurality of insulating layers, wherein the interconnect device is separated from the plurality of redistribution layers; and
a plurality of vias extending through the first insulating layer, wherein the vias have the same thickness as the first insulating layer;
forming a first conductive line and a second conductive line on the first insulating layer and on the interconnect device, wherein the first conductive line and the second conductive line are electrically coupled to the interconnect device; and
connecting a first die to the first conductive line and a second die to the second conductive line.

18. The method of claim 17 further comprising connecting an interconnect structure to the redistribution structure opposite the first die and the second die.

19. The method of claim 17, wherein the interconnect device comprises conductive routing in a silicon substrate.

20. The method of claim 17, wherein the first insulating layer comprises a different insulating material than a second insulating layer of the plurality of insulating layers.

* * * * *